United States Patent
Mizutani et al.

(10) Patent No.: US 9,929,174 B1
(45) Date of Patent: Mar. 27, 2018

(54) THREE-DIMENSIONAL MEMORY DEVICE HAVING NON-UNIFORM SPACING AMONG MEMORY STACK STRUCTURES AND METHOD OF MAKING THEREOF

(71) Applicant: SANDISK TECHNOLOGIES LLC, Plano, TX (US)

(72) Inventors: Yuki Mizutani, San Jose, CA (US); Hiroyuki Ogawa, Yokkaichi (JP); Fumiaki Toyama, Cupertino, CA (US); Masaaki Higashitani, Cupertino, CA (US); Fumitaka Amano, Yokkaichi (JP); Kota Funayama, Yokkaichi (JP); Akihiro Ueda, Yokkaichi (JP)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 15/337,235

(22) Filed: Oct. 28, 2016

(51) Int. Cl.
*H01L 27/115* (2017.01)
*H01L 27/11582* (2017.01)
(Continued)

(52) U.S. Cl.
CPC .... *H01L 27/11582* (2013.01); *H01L 27/1157* (2013.01); *H01L 27/11568* (2013.01);
(Continued)

(58) Field of Classification Search
CPC .......... H01L 29/0692; H01L 29/78642; H01L 29/7926; H01L 27/11568
(Continued)

(56) References Cited

U.S. PATENT DOCUMENTS 5,915,167 A   6/1999   Leedy
7,005,350 B2   2/2006   Walker et al.
(Continued)

FOREIGN PATENT DOCUMENTS

WO   WO2002/015277 A1   2/2002
WO   WO2016148748 A1   9/2016

OTHER PUBLICATIONS

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.
(Continued)

*Primary Examiner* — George Fourson, III
(74) *Attorney, Agent, or Firm* — The Marbury Law Group PLLC

(57) ABSTRACT

An alternating stack of insulating layers and sacrificial material layers is formed over a substrate. Memory stack structures including a memory film and a vertical semiconductor channel are formed through the alternating stack in an array configuration. Backside trenches extending along a lengthwise direction are formed through the alternating stack. Backside recesses are formed by removing the sacrificial material layers. Filling of the backside recesses with electrically conductive layers can be performed without voids or with minimal voids by arranging the memory stack structures with a non-uniform pitch. The non-uniform pitch may be along the direction perpendicular to the lengthwise direction such that the nearest neighbor distance among the memory stack structures is at a minimum between the backside trenches. Alternatively or additionally, the pitch may be modulated along the lengthwise direction to provide wider spacing regions that extend perpendicular to the lengthwise direction.

26 Claims, 34 Drawing Sheets

(51) Int. Cl.
*H01L 27/1157* (2017.01)
*H01L 29/786* (2006.01)
*H01L 29/792* (2006.01)
*H01L 27/11568* (2017.01)
*H01L 29/06* (2006.01)

(52) U.S. Cl.
CPC .... *H01L 29/0692* (2013.01); *H01L 29/78642* (2013.01); *H01L 29/7926* (2013.01)

(58) Field of Classification Search
USPC .......................................................... 257/321
See application file for complete search history.

(56) References Cited

U.S. PATENT DOCUMENTS

| | | | |
|---|---|---|---|
| 7,023,739 | B2 | 4/2006 | Chen et al. |
| 7,177,191 | B2 | 2/2007 | Fasoli et al. |
| 7,221,588 | B2 | 5/2007 | Fasoli et al. |
| 7,233,522 | B2 | 6/2007 | Chen et al. |
| 7,514,321 | B2 | 4/2009 | Mokhlesi et al. |
| 7,575,973 | B2 | 8/2009 | Mokhlesi et al. |
| 7,745,265 | B2 | 6/2010 | Mokhlesi et al. |
| 7,808,038 | B2 | 10/2010 | Mokhlesi et al. |
| 7,848,145 | B2 | 12/2010 | Mokhlesi et al. |
| 7,851,851 | B2 | 12/2010 | Mokhlesi et al. |
| 8,008,710 | B2 | 8/2011 | Fukuzumi |
| 8,053,829 | B2 | 11/2011 | Kang et al. |
| 8,349,681 | B2 | 1/2013 | Alsmeier et al. |
| 8,658,499 | B2 | 2/2014 | Makala et al. |
| 9,023,719 | B2 | 5/2015 | Pachamuthu et al. |
| 9,177,966 | B1 | 11/2015 | Rabkin et al. |
| 9,478,495 | B1* | 10/2016 | Pachamuthu ..... H01L 23/53223 |
| 9,530,790 | B1* | 12/2016 | Lu ...................... H01L 27/11582 |
| 2007/0210338 | A1 | 9/2007 | Orlowski |
| 2007/0252201 | A1 | 11/2007 | Kito et al. |
| 2009/0108333 | A1 | 4/2009 | Kito et al. |
| 2009/0242967 | A1 | 10/2009 | Katsumata et al. |
| 2010/0044778 | A1 | 2/2010 | Seol |
| 2010/0112769 | A1 | 5/2010 | Son et al. |
| 2010/0120214 | A1 | 5/2010 | Park et al. |
| 2010/0155810 | A1 | 6/2010 | Kim et al. |
| 2010/0155818 | A1 | 6/2010 | Cho |
| 2010/0181610 | A1 | 7/2010 | Kim et al. |
| 2010/0207195 | A1 | 8/2010 | Fukuzumi et al. |
| 2010/0320528 | A1 | 12/2010 | Jeong et al. |
| 2011/0076819 | A1 | 3/2011 | Kim et al. |
| 2011/0133606 | A1 | 6/2011 | Yoshida et al. |
| 2011/0198687 | A1 | 8/2011 | Lee |
| 2011/0223731 | A1* | 9/2011 | Chung ................ H01L 27/0207 438/270 |
| 2011/0266606 | A1 | 11/2011 | Park et al. |
| 2011/0280077 | A1 | 11/2011 | Fishburn |
| 2012/0001247 | A1 | 1/2012 | Alsmeier |
| 2012/0001249 | A1 | 1/2012 | Alsmeier |
| 2012/0001250 | A1 | 1/2012 | Alsmeier |
| 2012/0092926 | A1 | 4/2012 | Whang |
| 2012/0146122 | A1 | 6/2012 | Whang et al. |
| 2013/0264631 | A1 | 10/2013 | Alsmeier et al. |
| 2013/0313627 | A1 | 11/2013 | Lee et al. |
| 2014/0138760 | A1 | 5/2014 | Makala et al. |
| 2014/0273373 | A1 | 9/2014 | Makala et al. |
| 2015/0076584 | A1 | 3/2015 | Pachamuthu et al. |
| 2015/0145014 | A1* | 5/2015 | Shin .................. H01L 27/11563 257/314 |
| 2015/0179660 | A1 | 6/2015 | Yada et al. |
| 2015/0303209 | A1 | 10/2015 | Park et al. |
| 2016/0093635 | A1 | 3/2016 | Rabkin et al. |
| 2016/0141294 | A1* | 5/2016 | Peri .................. H01L 21/28512 257/324 |
| 2016/0284717 | A1* | 9/2016 | Wolstenholme .... H01L 27/0207 |
| 2017/0062337 | A1* | 3/2017 | Park .................... H01L 23/5283 |
| 2017/0117290 | A1* | 4/2017 | Lee .................. H01L 27/11582 |
| 2017/0125433 | A1* | 5/2017 | Ogawa ............. H01L 27/11556 |
| 2017/0125436 | A1* | 5/2017 | Sharangpani ..... H01L 27/11582 |
| 2017/0125437 | A1* | 5/2017 | Pachamuthu ..... H01L 27/11582 |
| 2017/0125438 | A1* | 5/2017 | Pachamuthu ..... H01L 27/11582 |

OTHER PUBLICATIONS

Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.

Maeda et al., "Multi-Stacked 1G Cell/Layer Pipe-Shaped BiCS Flash Memory," 2009 Symposium on VLSI Technology Digest of Technical Papers, pp. 22-23.

Endoh et al., "Novel Ultra High Density Memory with a Stacked-Surrounding Gate Transistor (S-SGT) Structured Cell," IEDM Proc. (2001) pp. 33-36.

Tanaka et al., "Bit-Cost Scalable Technology for Low-Cost and Ultrahigh-Density Flash Memory," Toshiba Review, vol. 63, No. 2, 2008, pp. 28-31.

Kimura, M., "3D Cells Make Terabit NAND Flash Possible," Nikkei Electronics Asia, Sep. 17, 2009, 6pgs.

International Search Report and Written Opinion, International Application No. PCT/US2011/042566, dated Jan. 17, 2012.

Invitation to Pay Additional Fees & Partial International Search Report, PCT/US2011/042566, dated Sep. 28, 2011.

Chen et al., "Reliability Characteristics of NiSi Nanocrystals Embedded in Oxide and Nitride Layers for Nonvolatile Memory Application," Applied Physics Letters, 92, 152114 (2008).

Invitation to Pay Additional Search Fees, International Application No. PCT/2013/048508, issued Sep. 18, 2013.

Jang et al., "Memory Properties of Nickel Silicide Nanocrystal Layer for Possible Application to Nonvolatile Memory Devices," IEEE Transactions on Electron Devices, vol. 56, No. 12, Dec. 2009.

International Search Report and Written Opinion, International Application No. PCT/US2013/048508, dated Dec. 18, 2013.

Chen et al., "Formation of $NiSi_2/SiN_x$ Compound Nanocrystal for Nonvolatile Memory Application," Thin Solid Films, Elsevier-Sequoia S.A., Lausanne, Switzerland, vol. 518, No. 24, pp. 7324-7327 (2010).

Diaz, "Low-k Dielectrics: Materials and Process Technology," EE518, Penn State University, Apr. 13, 2006.

Saraswat, "Low-k Dieletrics," Department of Electrical Engineering, Stanford University, Jul. 2008.

International Search Report and Written Opinion for PCT/US2015/049597, dated Apr. 8, 2016, 17 pages.

Invitation to Pay Additional Fees and, Where Applicable, Protest Fee and Communication Relating to the Results of the Partial International Search for International Application No. PCT/US2017/049674, dated Nov. 22, 2017, 16 pages.

International Search Report and Written Opinion of the International Searching Authority for International Patent Application No. PCT/US2017/049674, dated Jan. 18, 2018, 19 pages.

* cited by examiner

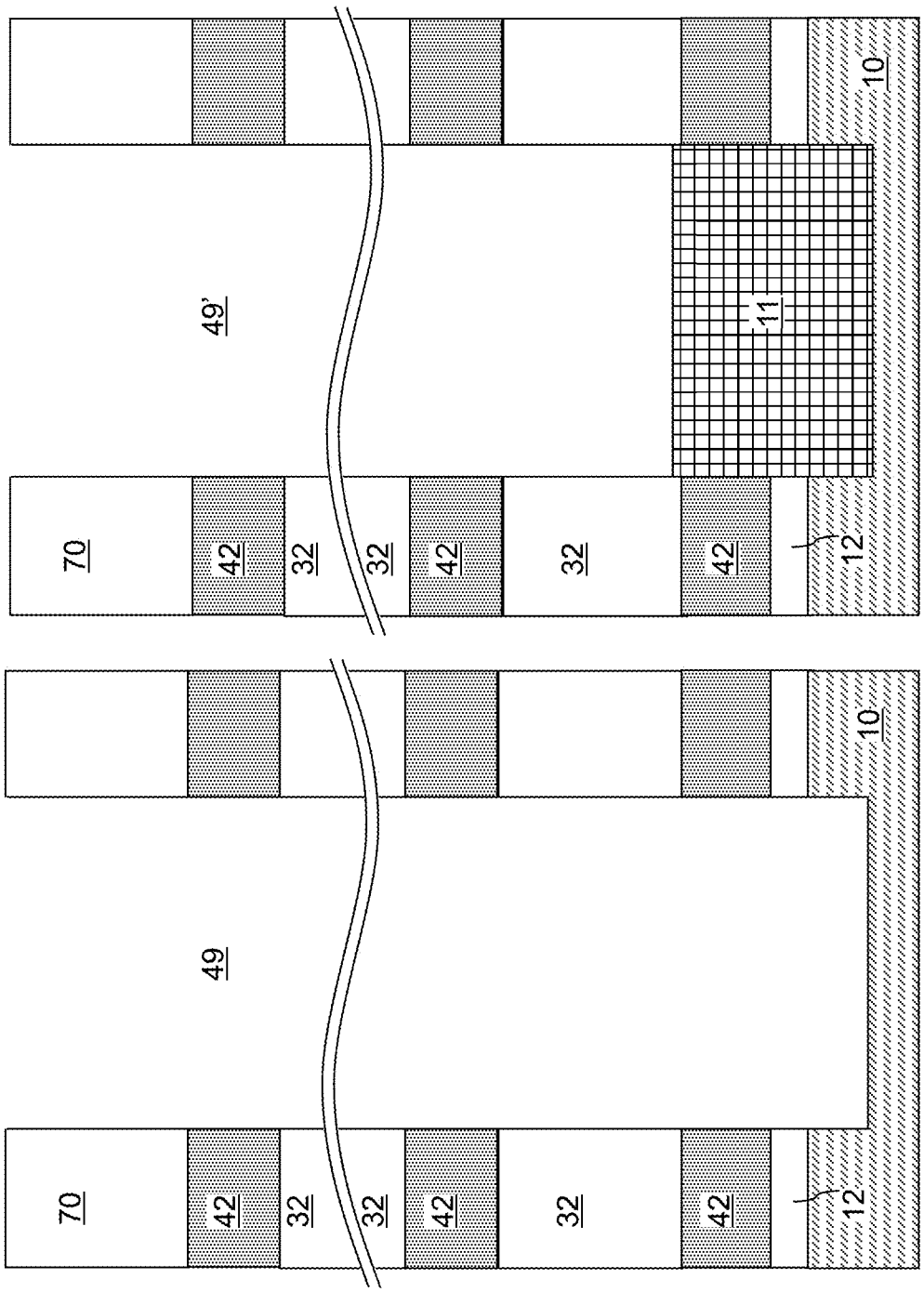

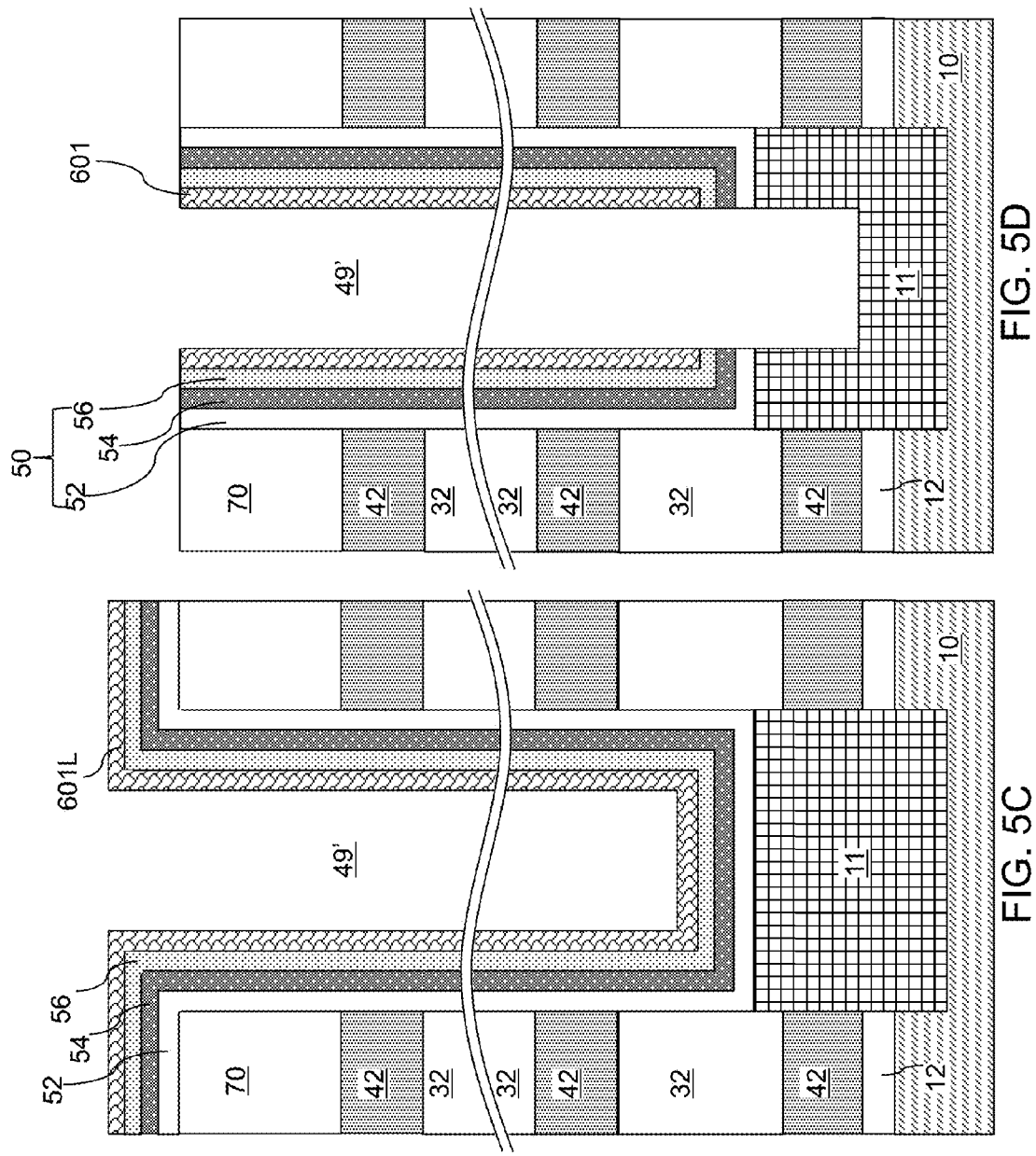

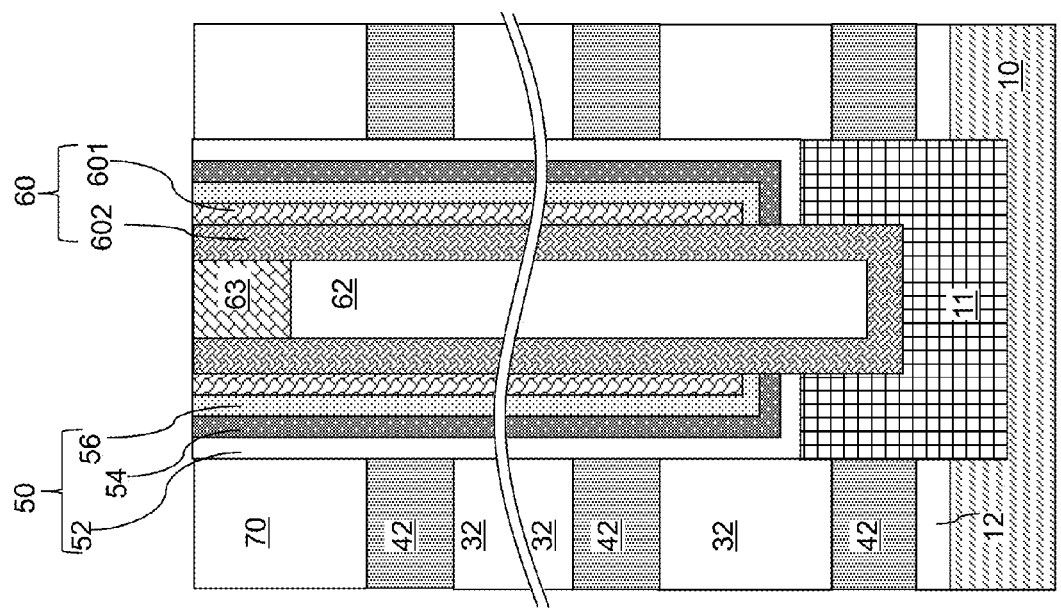
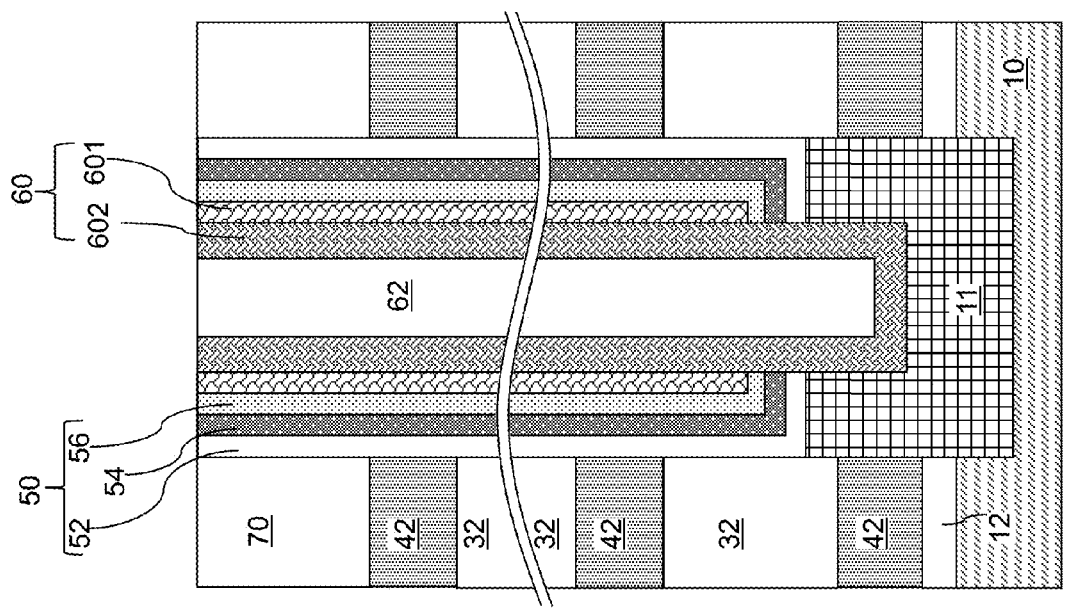

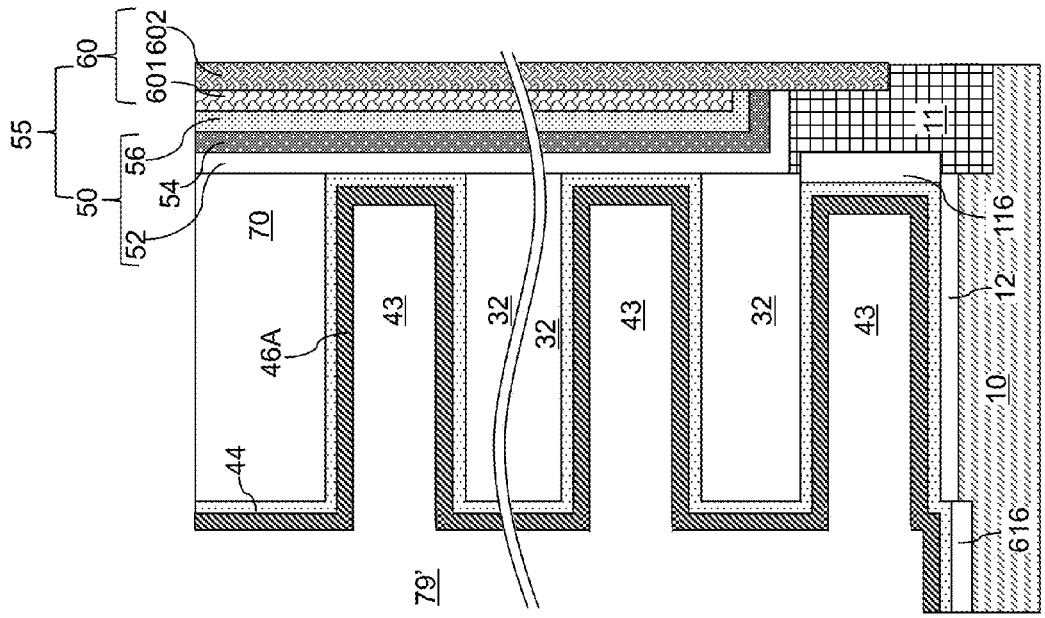
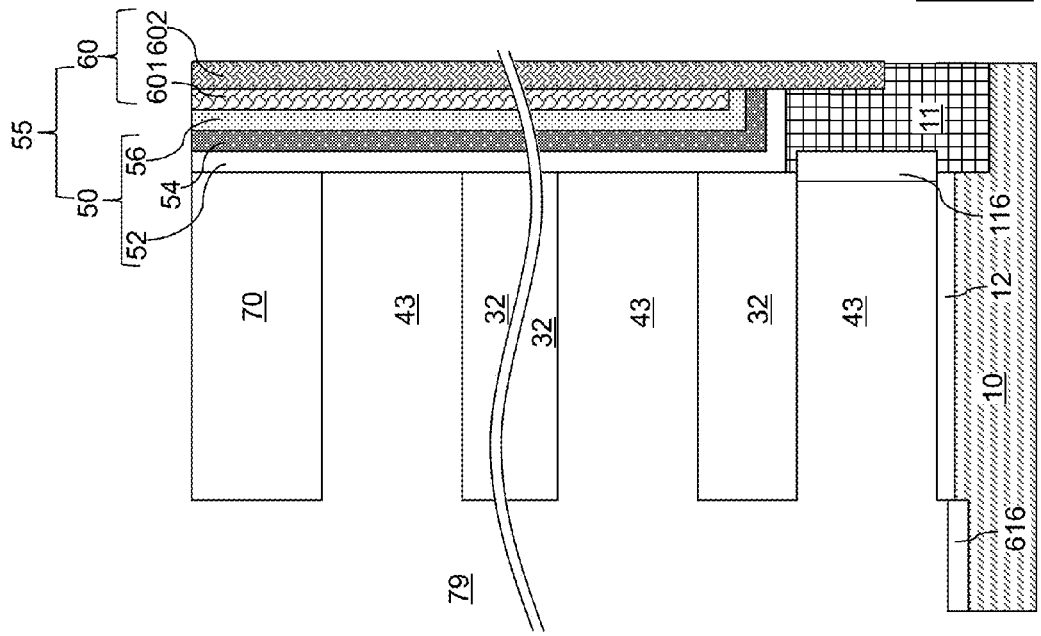
FIG. 9B
FIG. 9A

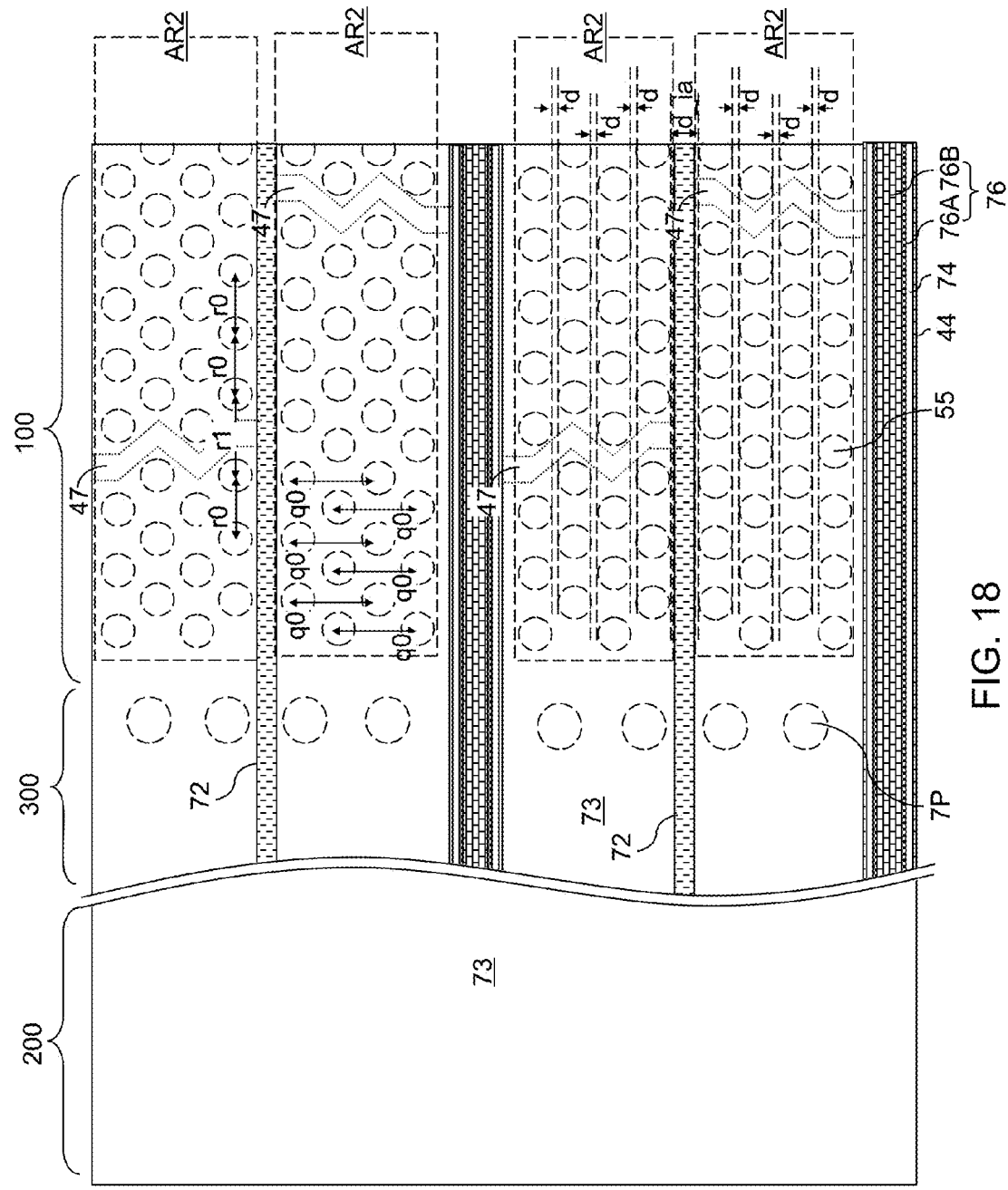

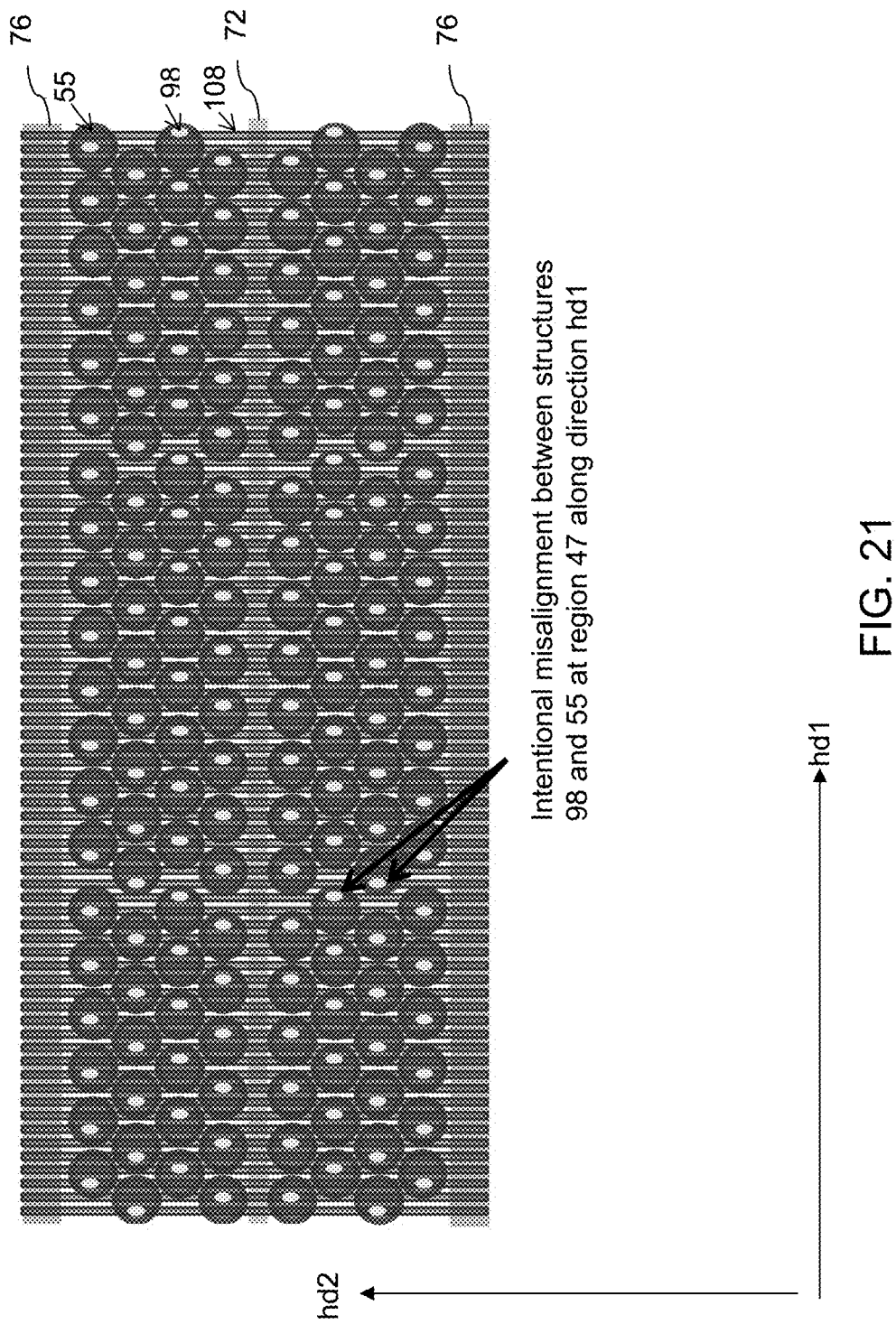

THREE-DIMENSIONAL MEMORY DEVICE HAVING NON-UNIFORM SPACING AMONG MEMORY STACK STRUCTURES AND METHOD OF MAKING THEREOF

FIELD

The present disclosure relates generally to the field of semiconductor devices, and particular to a three-dimensional memory device having non-uniform spacing among memory stack structures and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

The three-dimensional vertical NAND strings can be formed by forming an alternating stack of insulating layers and sacrificial material layers, and by replacing the sacrificial material layers with electrically conductive layers. Formation of voids during formation of the electrically conductive layers due to non-conformity can lead to electrical failures and/or structural instability of the three-dimensional NAND strings.

SUMMARY

According to an aspect of the present disclosure, a three-dimensional memory device is provided, which includes: an alternating stack of insulating layers and electrically conductive layers located over a substrate; and memory stack structures extending through the alternating stack. Each of the memory stack structures comprises a memory film and a vertical semiconductor channel. The memory stack structures are arranged in at least one two-dimensional array. Memory stack structures within each of the at least one two-dimensional array have a non-uniform pitch along a non-uniform pitch horizontal direction.

According to another aspect of the present disclosure, a method of forming a three-dimensional memory device is provided. An alternating stack of insulating layers and sacrificial material layers is formed over a substrate. Memory stack structures are formed through the alternating stack. Each of the memory stack structures comprises a memory film and a vertical semiconductor channel. A pair of backside trenches that horizontally extend along a lengthwise direction is formed. The sacrificial material layers are replaced with electrically conductive layers through the pair of backside trenches. The memory stack structures are arranged in at least one two-dimensional array. Memory stack structures within each of the at least one two-dimensional array have a non-uniform pitch along a non-uniform pitch horizontal direction.

BRIEF DESCRIPTION OF THE DRAWINGS

FIGS. 5A-5H are sequential schematic vertical cross-sectional views of a memory opening within the first exemplary structure during various processing steps employed to form a memory stack structure according to the first embodiment of the present disclosure.

FIGS. 9A-9C are sequential vertical cross-sectional views of a region of the first exemplary structure during formation of electrically conductive layers according to the first embodiment of the present disclosure.

FIG. 18 is a first alternative configuration for the second exemplary structure according to the second embodiment of the present disclosure.

FIG. 21 is a top-down view of the second exemplary structure after formation of bit lines according to the second embodiment of the present disclosure.

DETAILED DESCRIPTION

Figure 1:
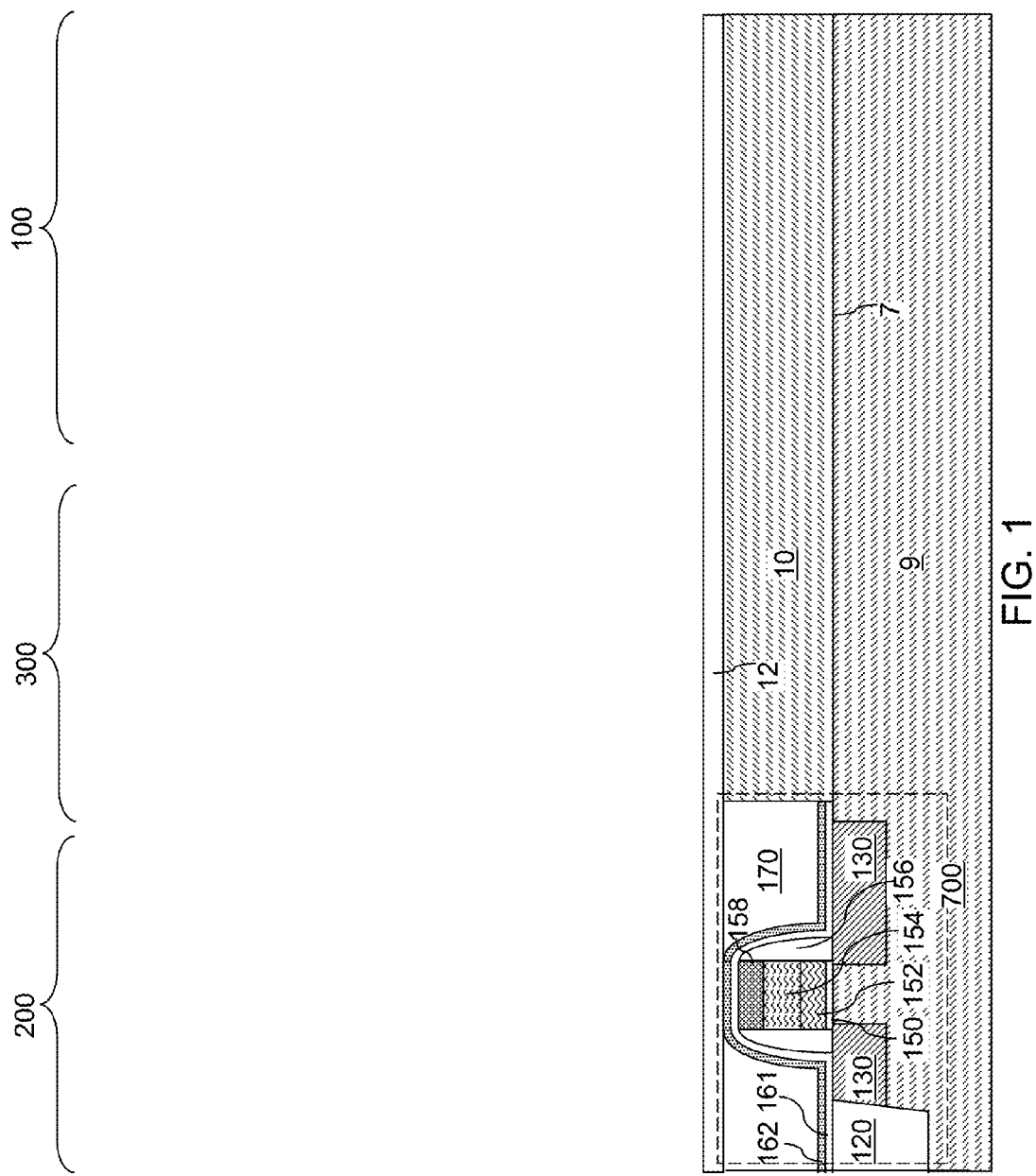
FIG. 1 is a schematic vertical cross-sectional view of a first exemplary structure after formation of at least one peripheral device, a semiconductor material layer, and a gate dielectric layer according to a first embodiment of the present disclosure.

As discussed above, the present disclosure is directed to three-dimensional memory devices including a vertical stack of multilevel memory arrays and methods of making thereof, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Referring to FIG. 1, an exemplary structure according to an embodiment of the present disclosure is illustrated, which can be employed, for example, to fabricate a device structure containing vertical NAND memory devices. The exemplary structure includes a substrate, which can be a semiconductor substrate (9, 10). The substrate can include a substrate semiconductor layer 9. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^5$ S/cm. As used herein, a "semiconductor material" refers to a material having electrical conductivity in the range from $1.0 \times 10^{-6}$ S/cm to $1.0 \times 10^5$ S/cm in the absence of electrical dopants therein, and is capable of producing a doped material having electrical conductivity in a range from 1.0 S/cm to $1.0 \times 10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than 1.0×10⁵ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 120 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (150, 152, 154, 158), each of which can include a gate dielectric 150, a gate electrode (152, 154), and a gate cap dielectric 158. The gate electrode (152, 154) may include a stack of a first gate electrode portion 152 and a second gate electrode portion 154. At least one gate spacer 156 can be formed around the at least one gate structure (150, 152, 154, 158) by depositing and anisotropically etching a dielectric liner. Active regions 130 can be formed in upper portions of the substrate semiconductor layer 9, for example, by introducing electrical dopants employing the at least one gate structure (150, 152, 154, 158) as masking structures. Additional masks may be employed as needed. The active region 130 can include source regions and drain regions of field effect transistors. A first dielectric liner 161 and a second dielectric liner 162 can be optionally formed. Each of the first and second dielectric liners (161, 162) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 161 can be a silicon oxide layer, and the second dielectric liner 162 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 170. In one embodiment the planarized top surface of the planarization dielectric layer 170 can be coplanar with a top surface of the dielectric liners (161, 162). Subsequently, the planarization dielectric layer 170 and the dielectric liners (161, 162) can be removed from an area to physically expose a top surface of the substrate semiconductor layer 9. As used herein, a surface is "physically exposed" if the surface is in physical contact with vacuum, or a gas phase material (such as air).

An optional semiconductor material layer 10 can be formed on the top surface of the substrate semiconductor layer 9 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the semiconductor substrate layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 170.

The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of electrically conductive layers can be provided between the memory array region 100 and the peripheral device region 200. Optionally, a gate dielectric layer 12 can be formed above the semiconductor material layer 10 and the planarization dielectric layer 170. The gate dielectric layer 12 can be, for example, silicon oxide layer. The thickness of the gate dielectric layer 12 can be in a range from 3 nm to 30 nm, although lesser and greater thicknesses can also be employed.

Figure 2:
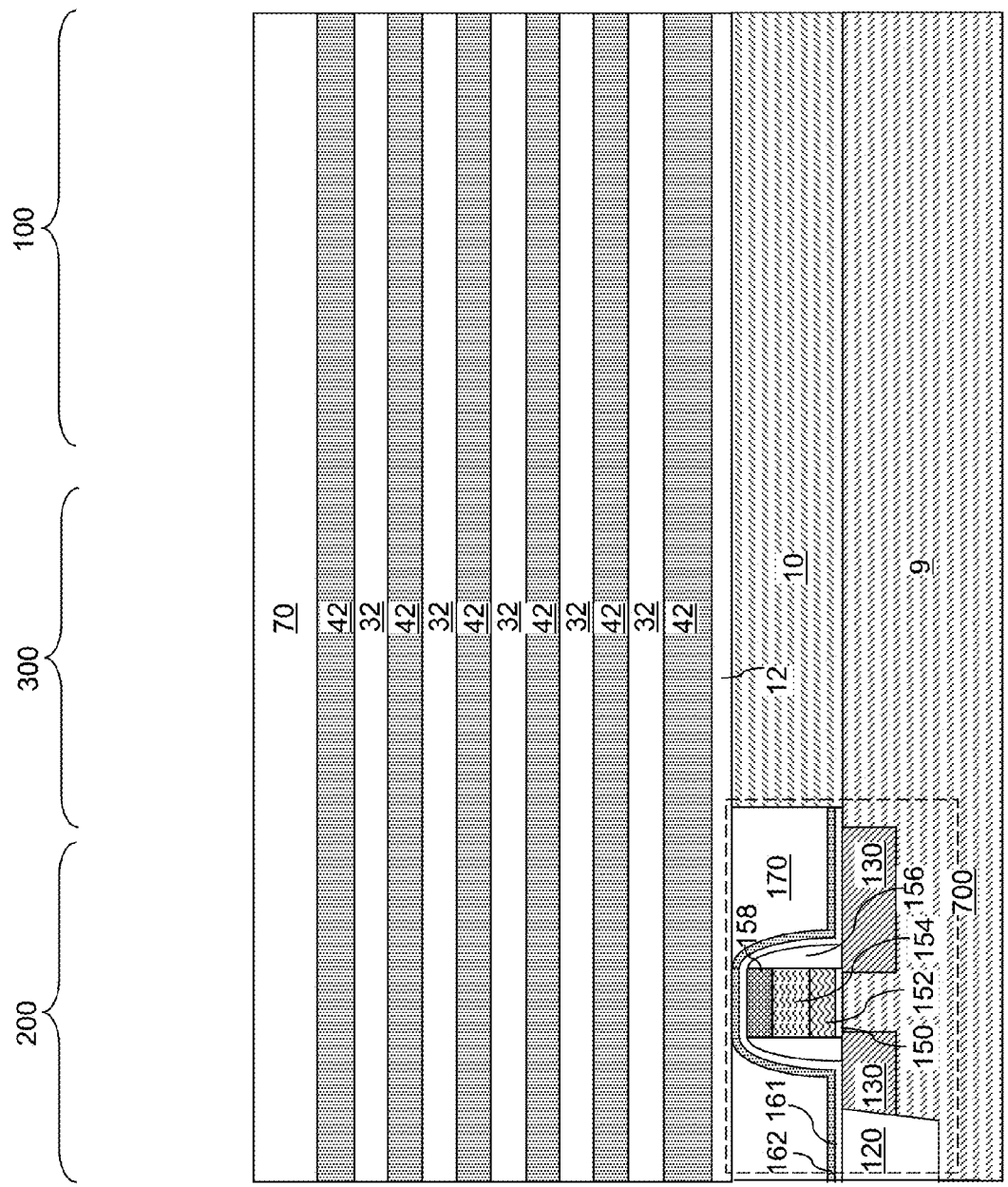
FIG. 2 is a schematic vertical cross-sectional view of the first exemplary structure after formation of an alternating stack of insulating layers and sacrificial material layers according to the first embodiment of the present disclosure.

Referring to FIG. 2, a stack of an alternating plurality of first material layers (which can be insulating layers 32) and second material layers (which can be sacrificial material layer 42) is formed over the top surface of the substrate, which can be, for example, on the top surface of the gate dielectric layer 12. As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42. As used herein, a "prototype" structure or an "in-process" structure refers to a transient structure that is subsequently modified in the shape or composition of at least one component therein.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 3:
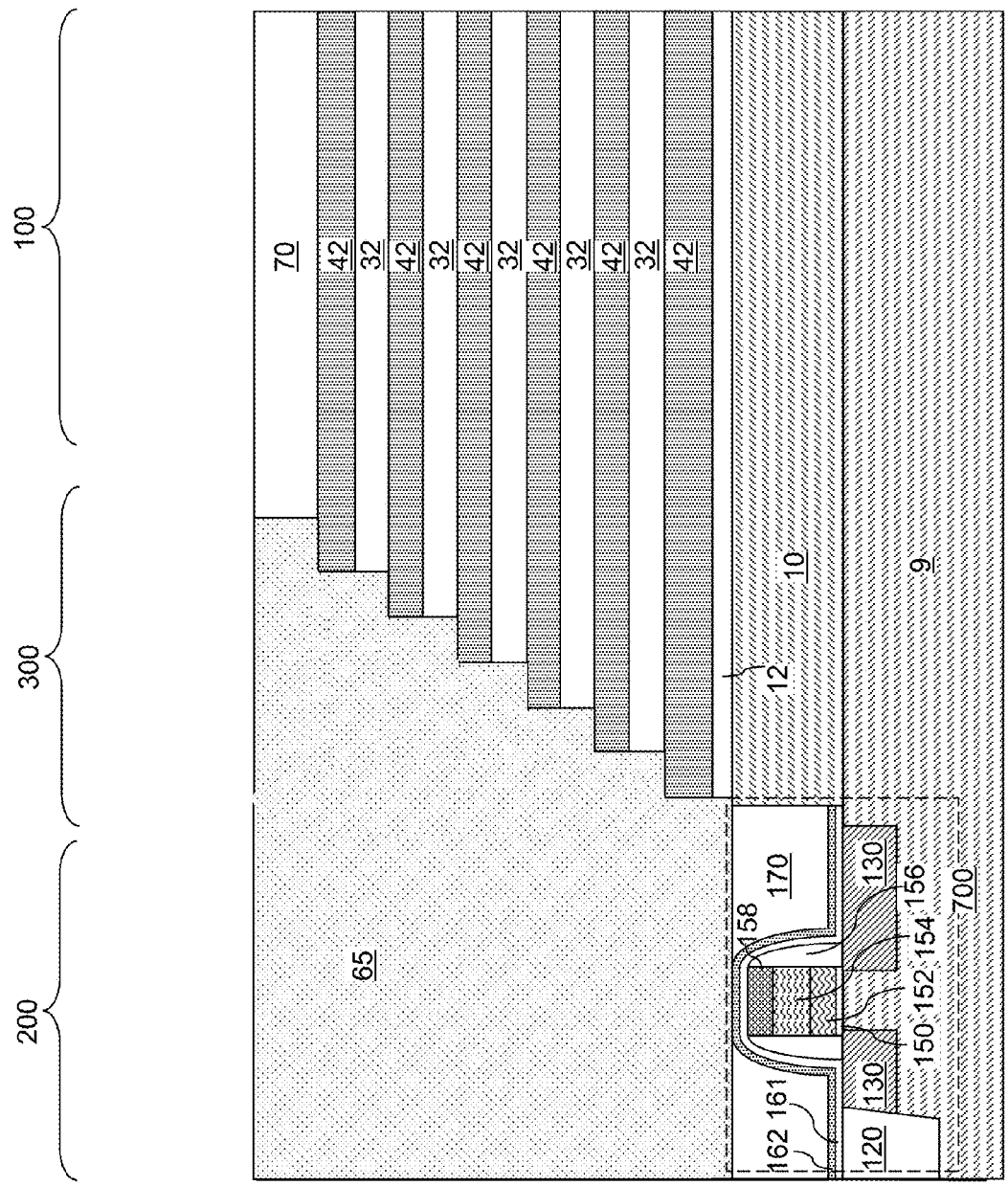
FIG. 3 is a schematic vertical cross-sectional view of the first exemplary structure after formation of stepped terraces and a retro-stepped dielectric material portion according to the first embodiment of the present disclosure.

Referring to FIG. 3, a stepped cavity can be formed within the contact region 300 which is located between the device region 100 and the peripheral region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

After formation of the stepped cavity, a peripheral portion of the alternating stack (32, 42) can have stepped surfaces after formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A terrace region is formed by patterning the alternating stack (32, 42). Each sacrificial material layer 42 other than a topmost sacrificial material layer 42 within the alternating stack (32, 42) laterally extends farther than any overlying sacrificial material layer 42 within the alternating stack (32, 42). The terrace region includes stepped surfaces of the alternating stack (32, 42) that continuously extend from a bottommost layer within the alternating stack (32, 42) to a topmost layer within the alternating stack (32, 42).

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Figure 4:
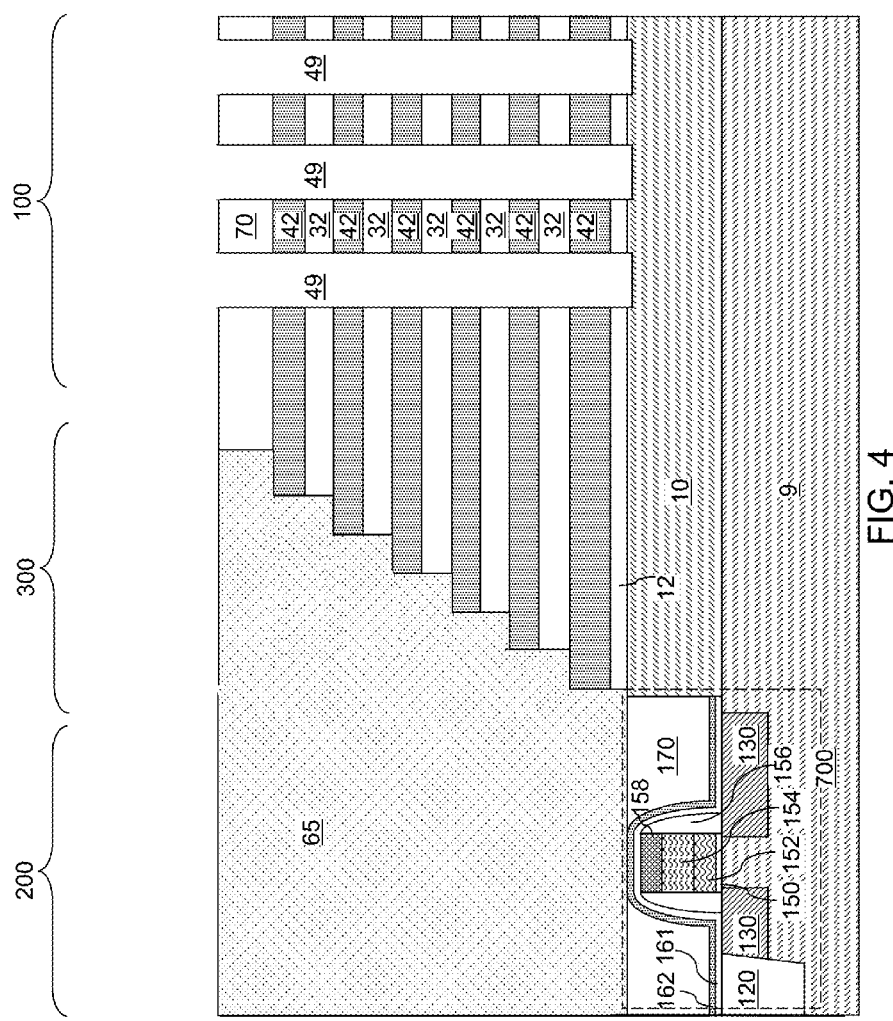
FIG. 4 is a schematic vertical cross-sectional view of the first exemplary structure after formation of memory openings according to the first embodiment of the present disclosure.

Referring to FIG. 4, a lithographic material stack (not shown) including at least a photoresist layer can be formed over the insulating cap layer 70 and the retro-stepped dielectric material portion 65, and can be lithographically patterned to form openings therein. The openings can be formed the memory array region 100. The pattern in the lithographic material stack can be transferred through the insulating cap layer 70 and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49. As used herein, a "memory opening" refers to a structure in which memory elements, such as a memory stack structure, is subsequently formed. The memory openings 49 are formed through the insulating cap layer 70 and the entirety of the alternating stack (32, 42) in the memory array region 100.

The memory openings 49 extend through the entirety of the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 can be substantially vertical, or can be tapered. The patterned lithographic material stack can be subsequently removed, for example, by ashing.

The memory openings 49 can be formed through the gate dielectric layer 12 so that the memory openings 49 extend from the top surface of the alternating stack (32, 42) to at least the horizontal plane including the top most surface of the semiconductor material layer 10. In one embodiment, an overetch into the semiconductor material layer 10 may be optionally performed after the top surface of the semiconductor material layer 10 is physically exposed at a bottom of each memory opening 49. The overetch may be performed prior to, or after, removal of the lithographic material stack. In other words, the recessed surfaces of the semiconductor material layer 10 may be vertically offset from the undressed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 can be coplanar with the topmost surface of the semiconductor material layer 10.

Each of the memory openings 49 may include a sidewall (or a plurality of sidewalls) that extends substantially perpendicular to the topmost surface of the substrate. A two-dimensional array of memory openings 49 can be formed in the memory array region 100. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 can be extend to a top surface of the substrate semiconductor layer 9.

According to an aspect of the present disclosure, the memory openings 49 can be arranged in a pattern that facilitates subsequent replacement of the sacrificial material layers 42 with electrically conducive layers without cavities or with cavities of minimal sizes. The memory openings 49 can be formed as at least one two-dimensional array having a uniform pitch along a uniform pitch horizontal direction and a non-uniform pitch along a non-uniform pitch horizontal direction. The arrangement of the memory openings 49 in a plan view is discussed hereafter.

Figure 5E:
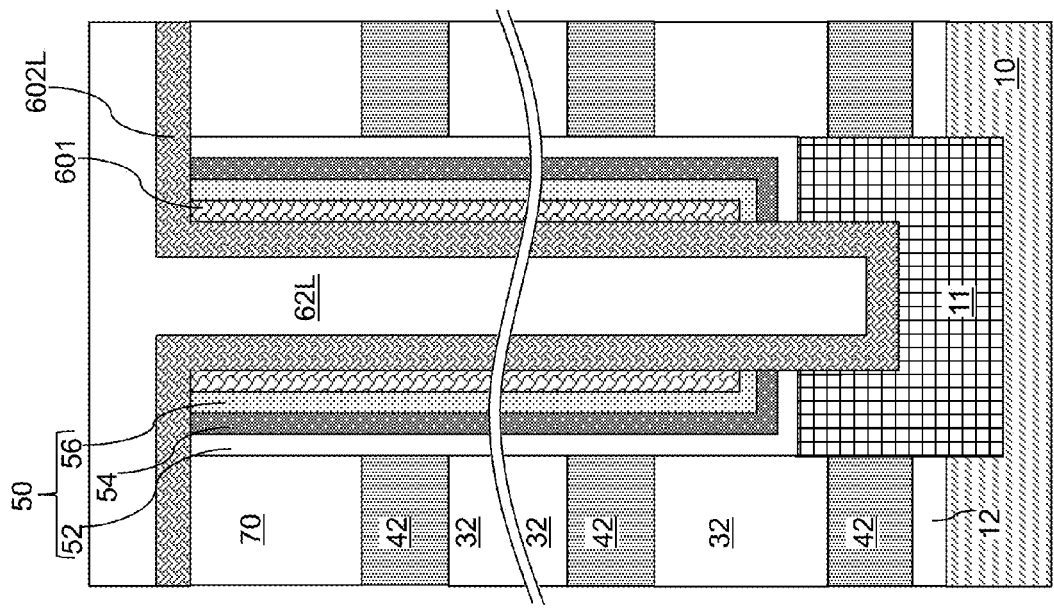

FIGS. 5A-5H illustrate structural changes in a memory opening 49, which is one of the memory openings 49 in the exemplary structure of FIG. 4. Referring to FIG. 5A, a memory opening 49 in the exemplary device structure of FIG. 4 is illustrated. The memory opening 49 extends through the insulating cap layer 70, the alternating stack (32, 42), the gate dielectric layer 12, and optionally into an upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 5B, an optional epitaxial channel portion (e.g., an epitaxial pedestal) 11 can be formed at the bottom portion of each memory opening 49, for example, by selective epitaxy. Each epitaxial channel portion 11 comprises a single crystalline semiconductor material in epitaxial alignment with the single crystalline semiconductor material of the semiconductor material layer 10. In one embodiment, the epitaxial channel portion 11 can be doped with electrical dopants of the same conductivity type as the semiconductor material layer 10. In one embodiment, the top surface of each epitaxial channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the epitaxial channel portions 11 with a respective conductive material layer. The epitaxial channel portion 11 can be a portion of a transistor channel that extends between a source region to be subsequently formed in the substrate (9, 10) and a drain region to be subsequently formed in an upper portion of the memory opening 49. A cavity 49' is present in the unfilled portion of the memory opening 49 above the epitaxial channel portion 11. In one embodiment, the epitaxial channel portion 11 can comprise single crystalline silicon. In one embodiment, the epitaxial channel portion 11 can have a doping of the first conductivity type, which is the same as the conductivity type of the semiconductor material layer 10 that the epitaxial channel portion contacts. If a semiconductor material layer 10 is not present, the epitaxial channel portion 11 can be formed directly on the substrate semiconductor layer 9, which can have a doping of the first conductivity type.

Referring to FIG. 5C, a stack of layers including a blocking dielectric layer 52, a charge storage layer 54, a tunneling dielectric layer 56, and an optional first semiconductor channel layer 601 can be sequentially deposited in the memory openings 49.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 can have vertically coincident sidewalls, and the charge storage layer 54 can be formed as a single continuous layer.

In another embodiment, the sacrificial material layers 42 can be laterally recessed with respect to the sidewalls of the insulating layers 32, and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A cavity 49' is formed in the volume of each memory opening 49 that is not filled with the deposited material layers (52, 54, 56, 601).

Referring to FIG. 5D, the optional first semiconductor channel layer 601, the tunneling dielectric layer 56, the charge storage layer 54, the blocking dielectric layer 52 are sequentially anisotropically etched employing at least one anisotropic etch process. The portions of the first semiconductor channel layer 601, the tunneling dielectric layer 56, the charge storage layer 54, and the blocking dielectric layer 52 located above the top surface of the insulating cap layer 70 can be removed by the at least one anisotropic etch process. Further, the horizontal portions of the first semiconductor channel layer 601, the tunneling dielectric layer 56, the charge storage layer 54, and the blocking dielectric layer 52 at a bottom of each cavity 49' can be removed to form openings in remaining portions thereof. Each of the first semiconductor channel layer 601, the tunneling dielectric layer 56, the charge storage layer 54, and the blocking dielectric layer 52 can be etched by anisotropic etch process.

Each remaining portion of the first semiconductor channel layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the sacrificial material layers 42 constitutes a charge storage region.

A surface of the epitaxial channel portion 11 (or a surface of the semiconductor substrate layer 10 in case the epitaxial channel portions 11 are not employed) can be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each cavity 49' can be vertically recessed so that the recessed semiconductor surface underneath the cavity 49' is vertically offset from the topmost surface of the epitaxial channel portion 11 (or of the semiconductor substrate layer 10 in case epitaxial channel portions 11 are not employed) by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (as embodied as the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 can have vertically coincident sidewalls.

Referring to FIG. 5E, a second semiconductor channel layer 602 can be deposited directly on the semiconductor surface of the epitaxial channel portion 11 or the semiconductor substrate layer 10 if portion 11 is omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Figure 5F:
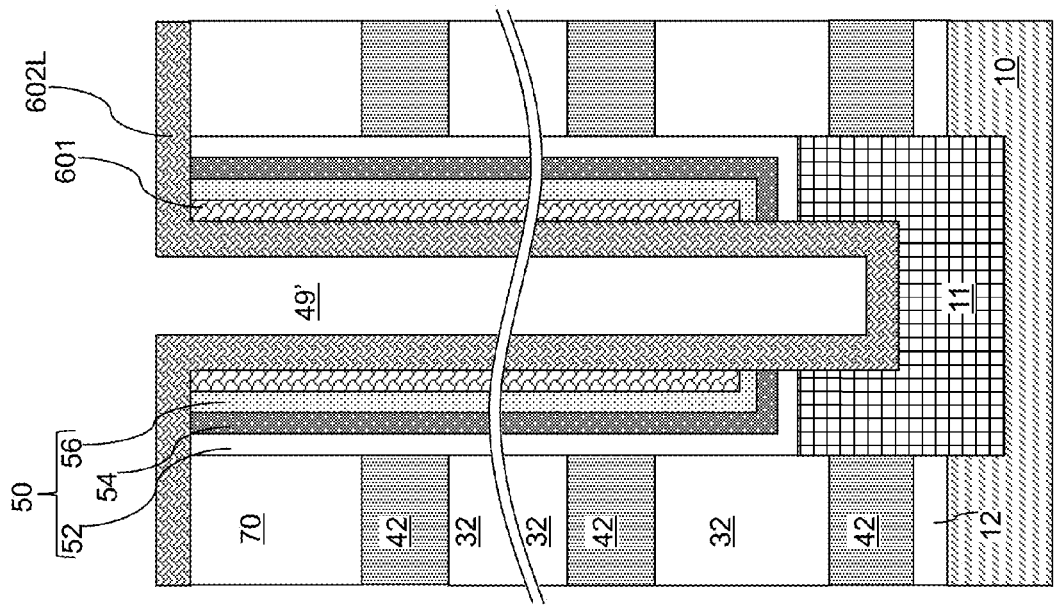

Referring to FIG. 5F, in case the cavity 49' in each memory opening is not completely filled by the second semiconductor channel layer 602, a dielectric core layer 62L can be deposited in the cavity 49' to fill any remaining portion of the cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 5G, the horizontal portion of the dielectric core layer 62L can be removed, for example, by a recess etch from above the top surface of the insulating cap layer 70. Each remaining portion of the dielectric core layer 62L constitutes a dielectric core 62. Further, the horizontal portion of the second semiconductor channel layer 602 located above the top surface of the insulating cap layer 70 can be removed by a planarization process, which can employ a recess etch or chemical mechanical planarization (CMP). Each remaining portion of the second semiconductor channel layer 602 can be located entirety within a memory opening 49.

Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a portion of the vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Referring to FIG. 5H, the top surface of each dielectric core 62 can be further recessed within each memory opening, for example, by a recess etch to a depth that is located between the top surface of the insulating cap layer 70 and the bottom surface of the insulating cap layer 70. Drain regions 63 can be formed by depositing a doped semiconductor material within each recessed region above the dielectric cores 62. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

Each combination of a memory film 50 and a vertical semiconductor channel 60 (which is a vertical semiconductor channel) within a memory opening 49 constitutes a memory stack structure 55. The memory stack structure 55 is a combination of a semiconductor channel, a tunneling dielectric layer, a plurality of memory elements as embodied as portions of the charge storage layer 54, and an optional blocking dielectric layer 52. Each combination of an epitaxial channel portion 11 (if present), a memory stack structure 55, a dielectric core 62, and a drain region 63 within a memory opening 49 is herein referred to as a memory opening fill structure (11, 55, 62, 63).

Figure 6A:
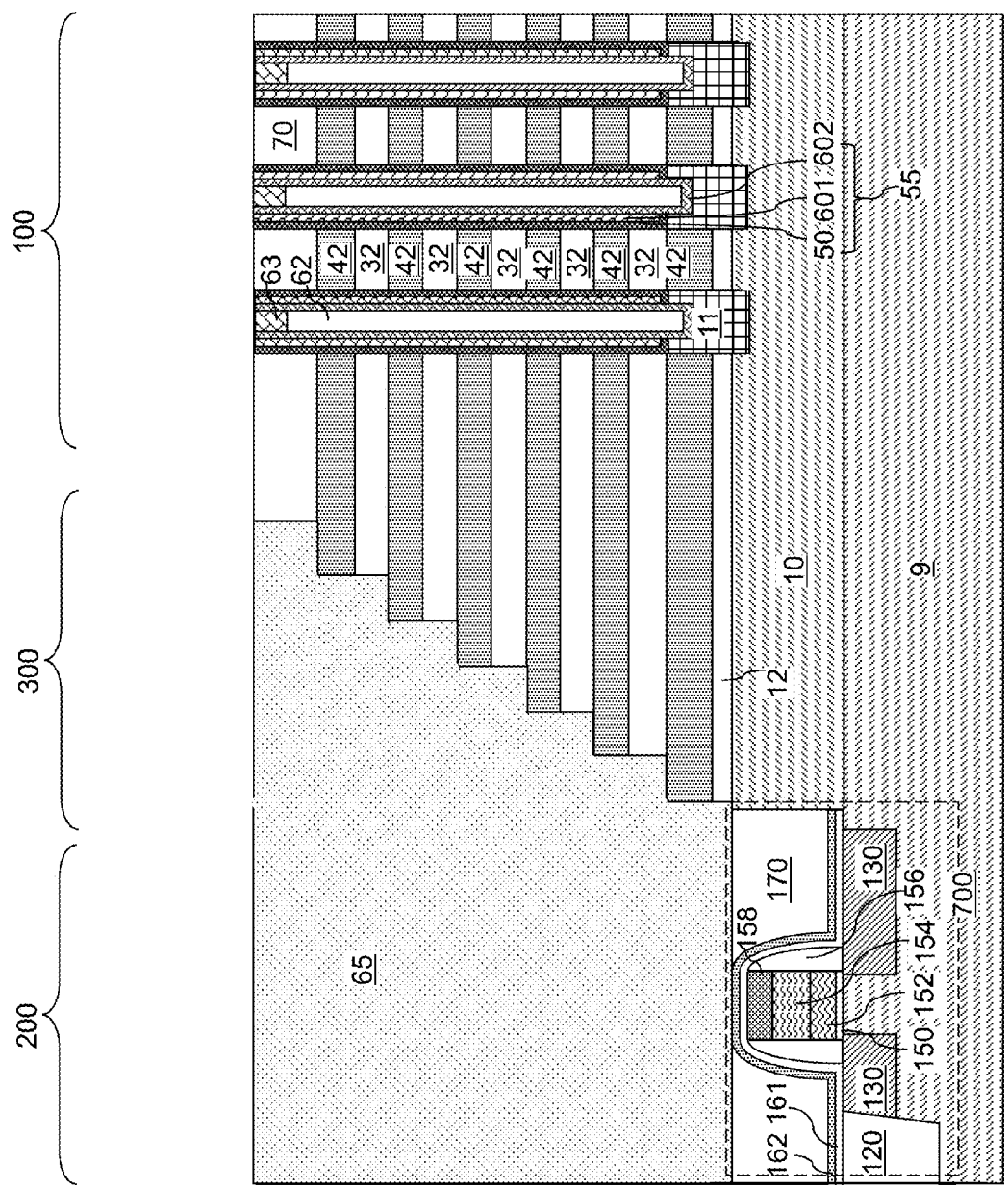
FIG. 6A is a schematic vertical cross-sectional view of the first exemplary structure after formation of memory stack structures according to the first embodiment of the present disclosure.
Figure 6B:
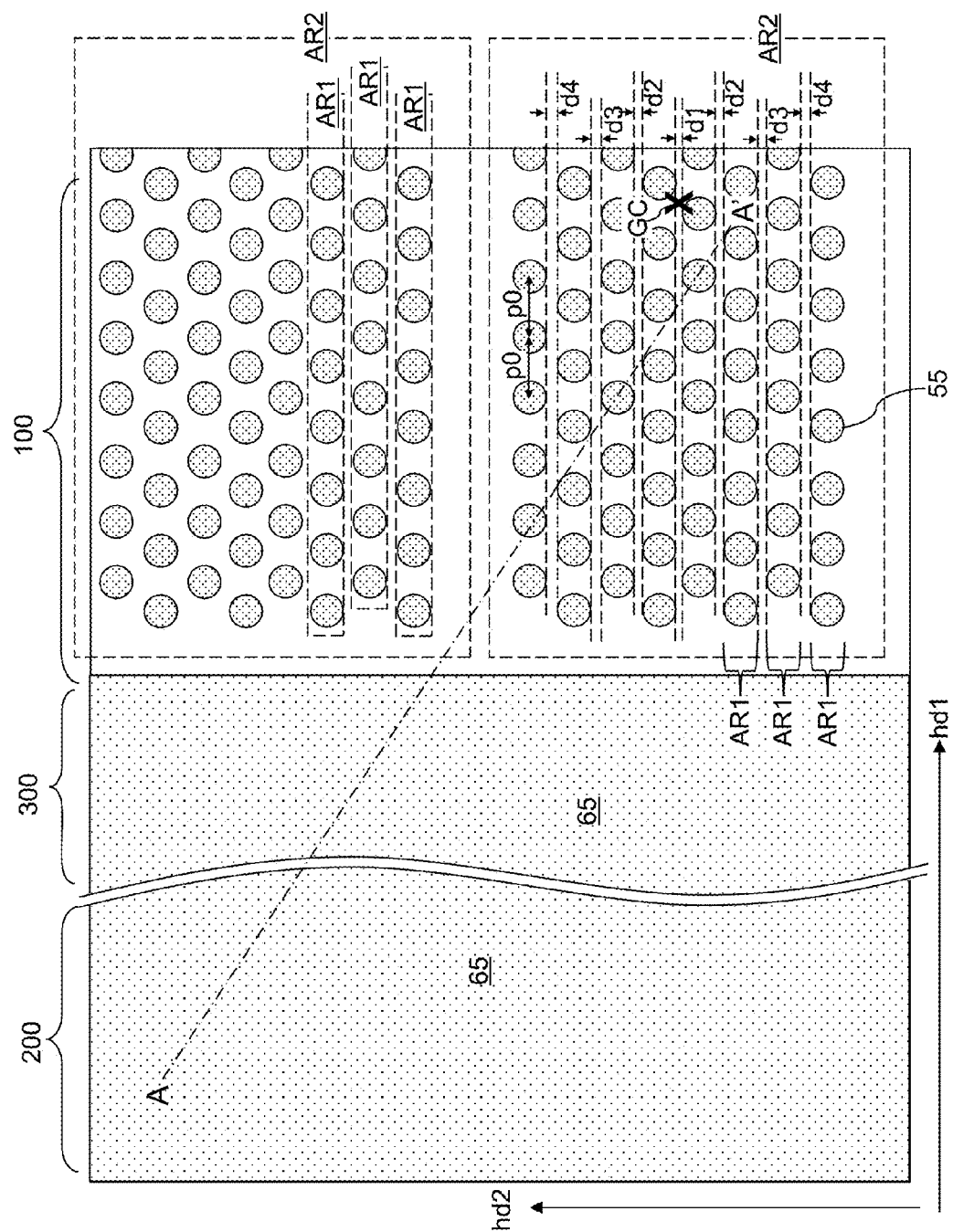
FIG. 6B is a top-down view of the first exemplary structure of FIG. 6A. The vertical plane A-A' is the plane of the schematic vertical cross-sectional view of FIG. 6A.

Referring to FIGS. 6A and 6B, the exemplary structure is illustrated after formation of memory opening fill structures (11, 55, 62, 63) within the memory openings 49. An instance of a memory opening fill structure (11, 55, 62, 63) can be formed within each memory opening 49 of the structure of FIG. 4.

According to an embodiment of the present disclosure, the memory openings 49, and as a consequence, the memory stack structures 55, can be arranged in at least one two-dimensional array AR2. The memory stack structures 55 within each of the at least one two-dimensional array AR2 can have a uniform pitch p0 along a uniform pitch horizontal direction (such as a first horizontal direction hd1) and a non-uniform pitch along a non-uniform pitch horizontal direction (such as a second horizontal direction hd2). The non-uniform pitch horizontal direction can be perpendicular to the uniform pitch horizontal direction.

In one embodiment, the at least one two-dimensional array AR2 can be a single two-dimensional array that includes rows of one-dimensional periodic arrays AR1 having the uniform pitch p0, and the rows of one-dimensional periodic arrays AR1 can have a non-uniform inter-row spacing (d1, d2, d3, d4) along the non-uniform pitch horizontal direction such as the second horizontal direction hd2.

In one embodiment, the non-uniform inter-row spacing (d1, d2, d3, d4) can be at a minimum for a pair of rows that is most proximal to a geometrical center GC of a respective two-dimensional array AR2. The geometrical center GC of each two-dimensional array refers to a point having coordinates that are averages of all coordinates of points in the respective two-dimensional array. In other words, the coordinates of all points within the memory opening fill structures (11, 55, 62, 63) in a two-dimensional array AR2 can be averaged to generate the coordinates of the geometrical center GC of the two-dimensional array AR2. In one embodiment, the non-uniform inter-row spacing (d1, d2, d3, d4) can increase with a lateral distance from the geometrical center of the two-dimensional array AR2 along the non-uniform pitch horizontal direction such as the second horizontal direction hd2.

The inter-row spacing (d1, d2, d3, d4) can be a gradually varying function of the distance along the non-uniform pitch horizontal direction (such as the second horizontal direction hd2) from the geometrical center GC of each two-dimensional array AR2. In a non-limiting illustrative example, a first inter-row spacing d1 that is most proximal to, and may overlie, the geometrical center GC of each two-dimensional array AR2 can be in a range from 0 nm to 20 nm (such as from 2 nm to 10 nm), a second inter-row spacing d2 laterally offset from the geometrical center AR2 by a row of a one-dimensional array AR1 can be in a range from 4 nm to 40 nm (such as from 6 nm to 20 nm), a third inter-row spacing d3 laterally offset from the geometrical center AR2 by two rows of one-dimensional arrays AR1 can be in a range from 8 nm to 60 nm (such as from 10 nm to 30 nm), and a fourth inter-row spacing d4 laterally offset from the geometrical center AR2 by three rows of one-dimensional arrays AR1 can be in a range from 12 nm to 80 nm (such as from 14 nm to 40 nm). In other words, in one embodiment, the spacing may have the following relationship: d4>d3>d2>d1.

Each exemplary memory stack structure 55 includes a vertical semiconductor channel 60 which may comprise multiple semiconductor channel layers (601, 602) and a memory film 50. The memory film 50 may comprise a tunneling dielectric layer 56 laterally surrounding the vertical semiconductor channel 60 and a vertical stack of charge storage regions laterally surrounding the tunneling dielectric layer 56 (as embodied as a memory material layer 54) and an optional blocking dielectric layer 52. While the present disclosure is described employing the illustrated configuration for the memory stack structure, the methods of the present disclosure can be applied to alternative memory stack structures including different layer stacks or structures for the memory film 50 and/or for the vertical semiconductor channel 60.

Figure 7A:
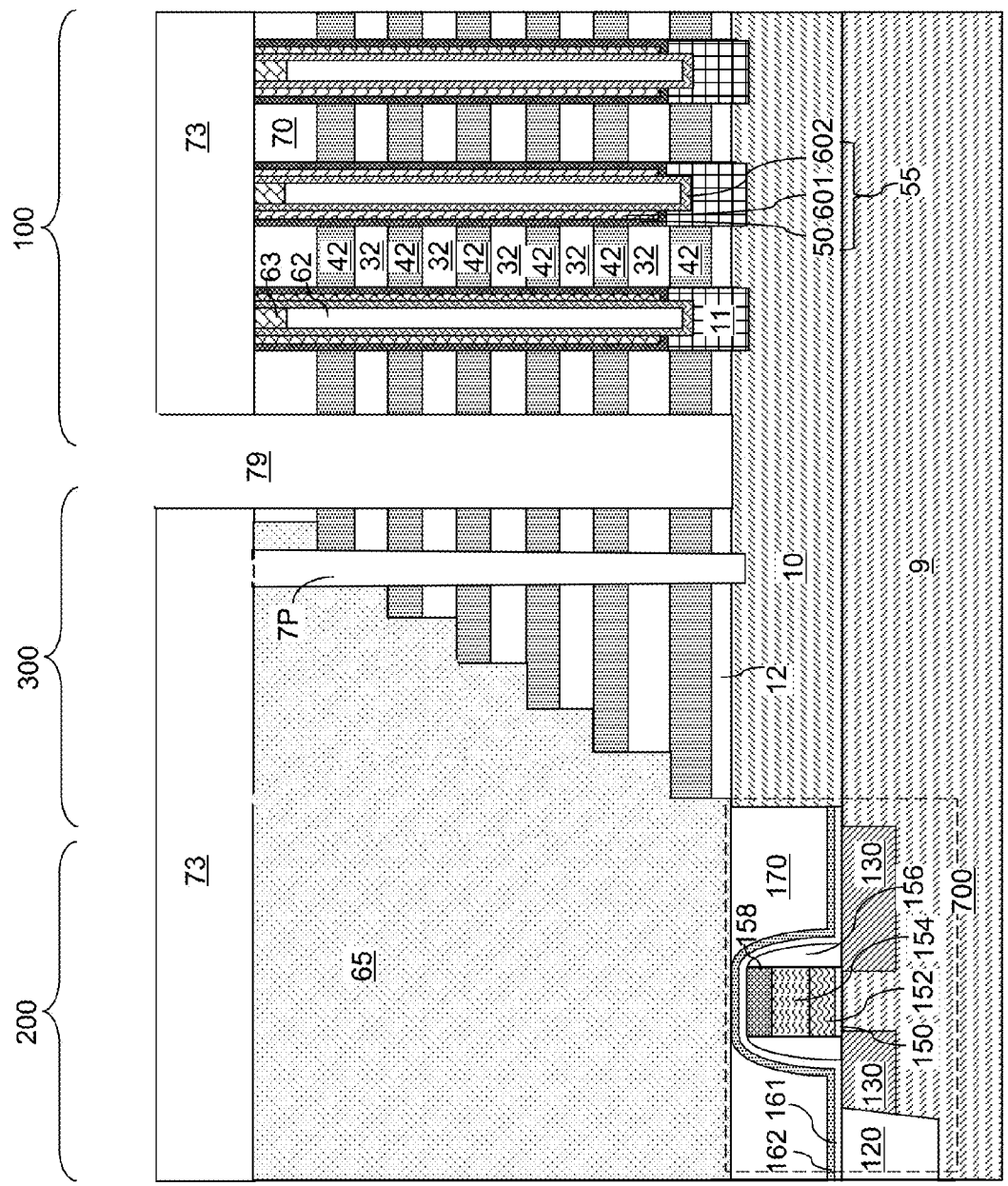
FIG. 7A is a schematic vertical cross-sectional view of the first exemplary structure after formation of a backside trench according to the first embodiment of the present disclosure.
Figure 7B:
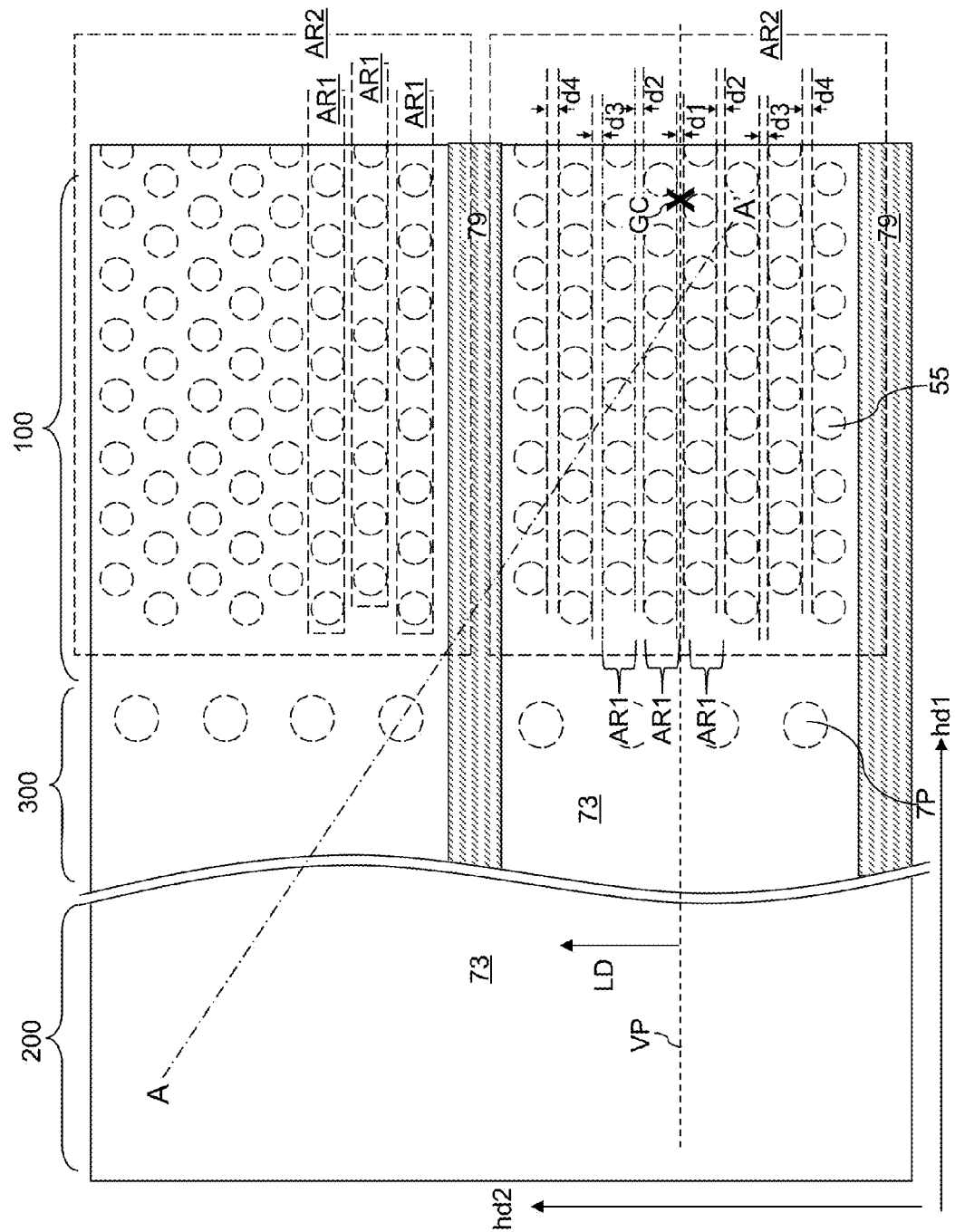
FIG. 7B is a top-down view of the first exemplary structure of FIG. 7A. The vertical plane A-A' is the plane of the schematic vertical cross-sectional view of FIG. 7A.

Referring to FIGS. 7A and 7B, at least one support pillar, such as a dielectric support pillar 7P may be optionally formed through the retro-stepped dielectric material portion 65 and/or through the alternating stack (32, 42). In one embodiment, the at least one dielectric support pillar 7P can be formed in the contact region 300, which is located adjacent to the device region 100. The at least one dielectric support pillar 7P can be formed, for example, by forming an opening extending through the retro-stepped dielectric material portion 65 and/or through the alternating stack (32, 42) and at least to the top surface of the substrate (9, 10), and by filling the opening with a dielectric material that is resistant to the etch chemistry to be employed to remove the sacrificial material layers 42.

In one embodiment, the at least one dielectric support pillar 7P can include silicon oxide and/or a dielectric metal oxide such as aluminum oxide. In one embodiment, the portion of the dielectric material that is deposited over the insulating cap layer 70 concurrently with deposition of the at least one dielectric support pillar 7P can be present over the insulating cap layer 70 as a contact level dielectric layer 73. Each of the at least one dielectric support pillar 7P and the contact level dielectric layer 73 is an optional structure. As such, the contact level dielectric layer 73 may, or may not, be present over the insulating cap layer 70 and the retro-stepped dielectric material portion 65. Alternatively, formation of the contact level dielectric layer 73 may be omitted, and at least one contact level dielectric layer may be subsequently formed, i.e., after formation of a backside contact via structure.

The contact level dielectric layer 73 and the at least one dielectric support pillar 7P can be formed as a single contiguous structure of integral construction, i.e., without any material interface therebetween. In another embodiment, the portion of the dielectric material that is deposited over the insulating cap layer 70 concurrently with deposition of the at least one dielectric support pillar 7P can be removed, for example, by chemical mechanical planarization or a recess etch. In this case, the contact level dielectric layer 73 is not present, and the top surface of the insulating cap layer 70 can be physically exposed.

In an alternative embodiment, support pillar structures may comprise dummy memory stack structures (not shown) which can be formed in lieu of the at least one dielectric support pillars 7P during the processing steps that are employed to form the memory stack structures 55. For example, support openings (not shown) can be formed in the contact region 300 through the alternating stack (32, 42) and optionally through the retro-stepped dielectric material portion 65 simultaneously with formation of the memory openings 49 (e.g., at the processing steps of FIG. 4). Each support openings can be filled with a set of material portions including an instance of an epitaxial channel portion 11, an instance of a memory film 50, an instance of a vertical semiconductor channel 60, an instance of a dielectric core 62, and an instance of a drain region 63 to form a support pillar structure. Each component of a support pillar structure can have a one-to-one correspondence with a respective component of a memory opening fill structure (11, 55, 62, 63) that has the same material composition and may have a same thickness. Thus, support pillar structures can be formed simultaneously formed with formation of the memory opening fill structures (11, 55, 62, 63). Each component of a support pillar structure can be a dummy component that is not electrically active, i.e., not functional as an electrical node of any device. Thus, the drain regions of the support pillar structures are dummy drain regions that are not contacted by any contact via structure, and the vertical semiconductor channel in the support pillar structures are not employed as a channel of any semiconductor device. Instead, the support pillar structures are employed merely for structural support during subsequent replacement of the sacrificial material layers 42 with electrically conductive layers.

The contact level dielectric layer 73 includes a dielectric material that is different from the dielectric material of the sacrificial material layers 42. For example, the contact level dielectric layer 73 can include silicon oxide. The contact level dielectric layer 73 can have a thickness in a range from 50 nm to 500 nm, although lesser and greater thicknesses can also be employed.

A photoresist layer (not shown) can be applied over the alternating stack (32, 42), and is lithographically patterned to form openings in areas between clusters of memory stack structures 55. The pattern in the photoresist layer can be transferred through the alternating stack (32, 42) and/or the retro-stepped dielectric material portion 65 employing an anisotropic etch to form backside trenches 79, which vertically extend at least to the top surface of the substrate (9, 10), and laterally extend through the memory array region 100 and the contact region 300. In one embodiment, the backside trenches 79 can include a source contact opening in which a source contact via structure can be subsequently formed. The photoresist layer can be removed, for example, by ashing.

The backside trenches 79 horizontally extend along a common lengthwise direction. The lengthwise direction can be parallel to the uniform pitch horizontal direction (such as the first horizontal direction hd1). The non-uniform pitch horizontal direction (which is the second horizontal direction hd2) can be perpendicular to the lengthwise direction of the backside trenches 79. The backside trenches 79 can be formed between each neighboring pair of two-dimensional arrays AR2 of memory stack structures 55. A pair of backside trenches horizontally extends along the lengthwise direction on each side of a two-dimensional array AR2 of memory stack structures 55. In other words, a two-dimensional array AR2 of memory stack structures 55 is provided between a neighboring pair of backside trenches 79.

Figure 8:
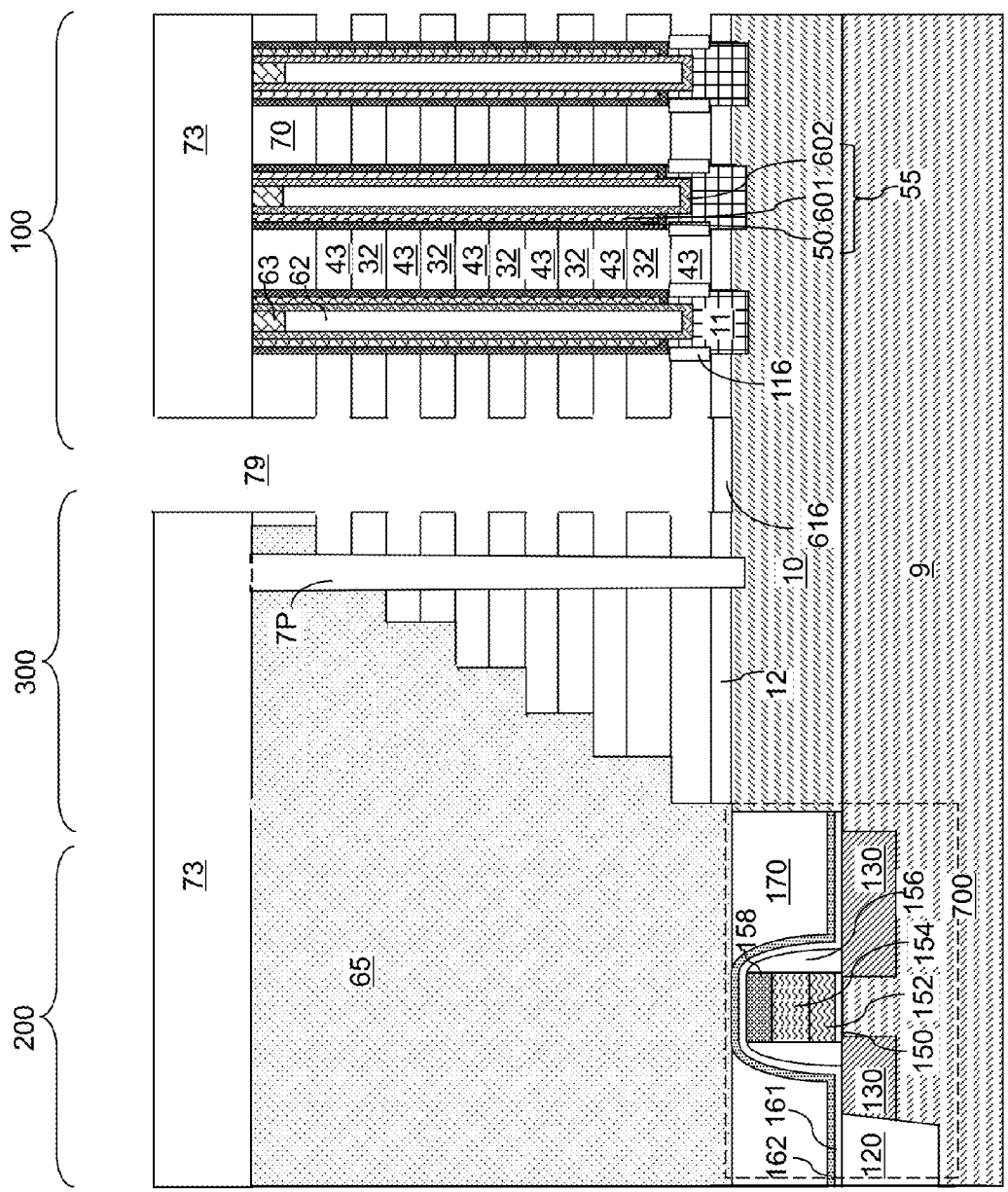
FIG. 8 is a schematic vertical cross-sectional view of the first exemplary structure after formation of backside recesses according to the first embodiment of the present disclosure.

In one embodiment, the non-uniform inter-row spacing (d1, d2, d3, d4) can be at a minimum for a pair of rows that is most proximal to a vertical plane VP that is equidistant from a neighboring pair of backside trenches 79. The geometrical center GC of a two-dimensional array AR2 of memory stack structures 55 can be within the vertical plane VP. In one embodiment, the non-uniform inter-row spacing (d1, d2, d3, d4) can increase with a lateral distance LD from the vertical plane VP that is equidistant from the pair of backside trenches 79 toward either of the pair of the backside trenches 79. Referring to FIGS. 8 and 9A, an etchant that selectively etches the second material of the sacrificial material layers 42 with respect to the first material of the insulating layers 32 can be introduced into the backside trenches 79, for example, employing an etch process. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32, the support pillar structure 7P, and the retro-stepped dielectric material portion 65 can be selected from silicon oxide and dielectric metal oxides.

In another embodiment, the sacrificial material layers 42 can include a semiconductor material such as polysilicon, and the materials of the insulating layers 32 and the retro-stepped dielectric material portion 65 can be selected from silicon oxide, silicon nitride, and dielectric metal oxides. In this case, the depth of the backside trenches 79 can be modified so that the bottommost surface of the backside trenches 79 is located within the gate dielectric layer 12, i.e., to avoid physical exposure of the top surface of the semiconductor material layer 10.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structure 7P, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Physically exposed surface portions of the optional epitaxial channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each epitaxial channel portion 11 into a tubular dielectric spacer 116, and to convert each physically exposed surface portion of the semiconductor material layer 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the epitaxial channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the epitaxial channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10.

Referring to FIG. 9B, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer is optional. In case the blocking dielectric layer 52 is omitted, the backside blocking dielectric layer is present.

The backside blocking dielectric layer 44 can be formed in the backside recesses 43 and on a sidewall of the backside trench 79. The backside blocking dielectric layer 43 can be formed directly on horizontal surfaces of the insulating layers 32 and sidewalls of the memory stack structures 55 within the backside recesses 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer can include a silicon oxide layer. The backside blocking dielectric layer can be deposited by a conformal deposition method such as chemical vapor deposition or atomic layer deposition. The thickness of the backside blocking dielectric layer can be in a range from 1 nm to 10 nm, although lesser and greater thicknesses can also be employed. The backside blocking dielectric layer is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' is present within the portion of each backside trench 79 that is not filled with the backside blocking dielectric layer.

Referring to FIG. 9B, a metallic barrier layer 46A can be deposited in the backside recesses. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

Figure 9C:
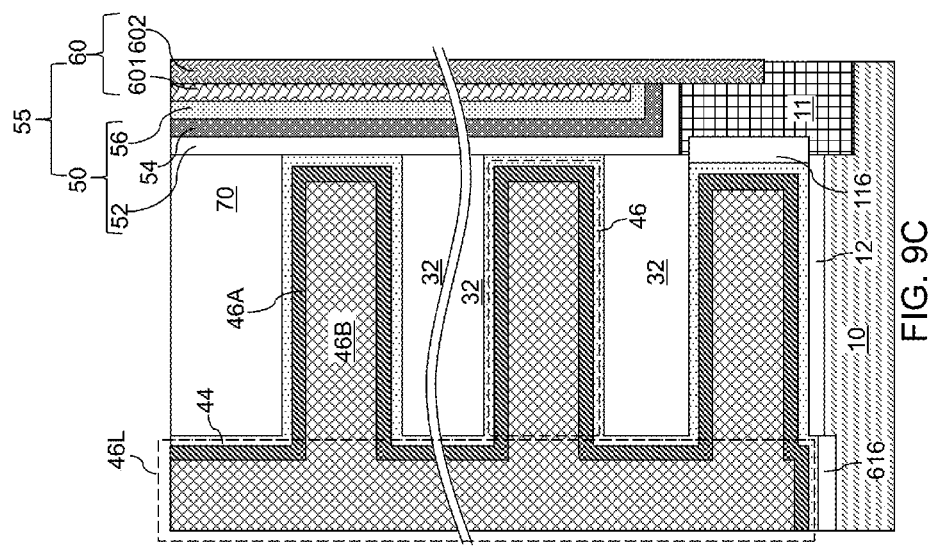
Figure 10:
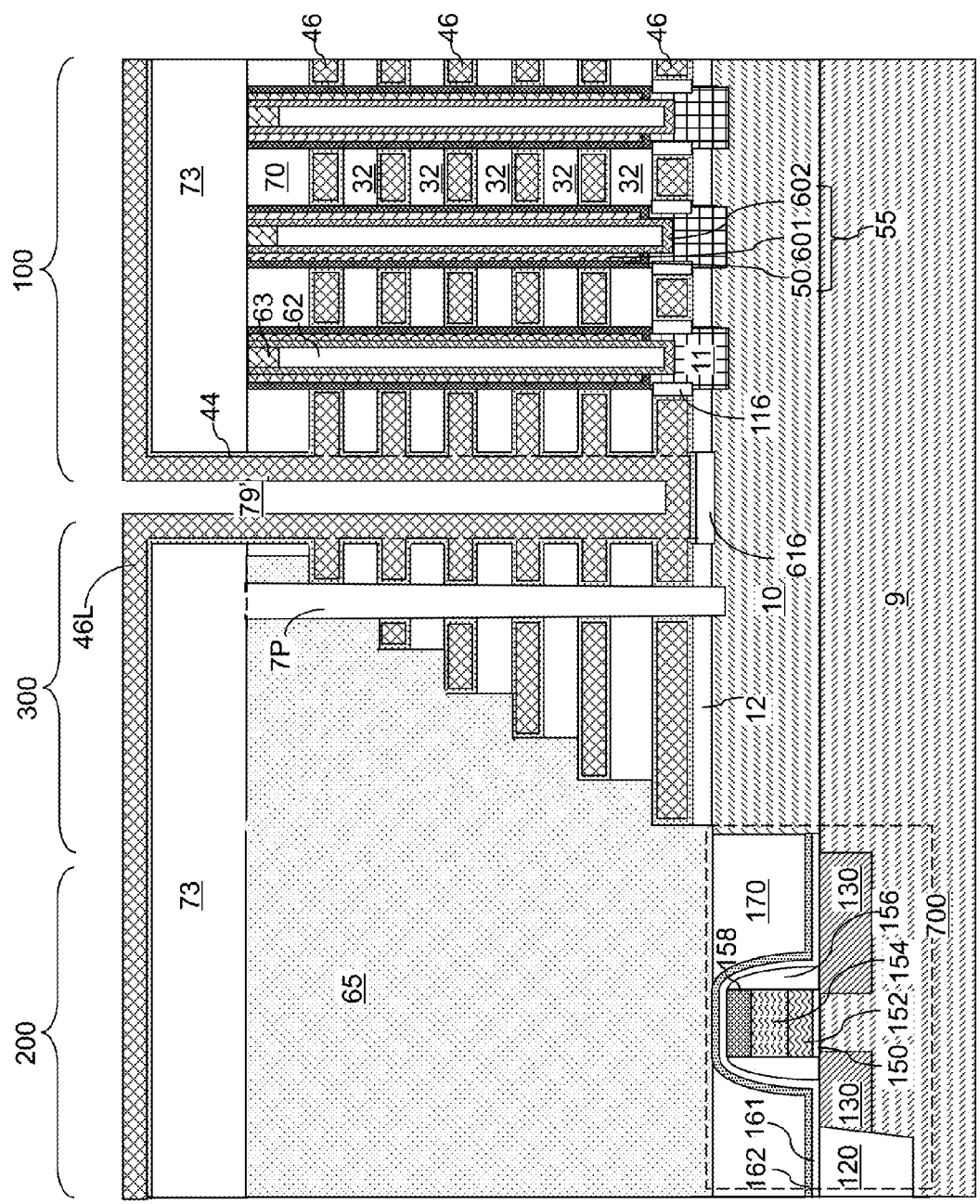
FIG. 10 is a schematic vertical cross-sectional view of the first exemplary structure at the processing step of FIG. 9C.

Referring to FIGS. 9C and 10, a metal fill material is deposited in the plurality of backside recesses 43, on the sidewalls of the at least one the backside contact trench 79, and over the top surface of the contact level dielectric layer 73 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited employing a fluorine-containing precursor gas such as $WF_6$. In one embodiment, the metallic fill material layer 46B can be a tungsten layer including a residual level of fluorine atoms as impurities. The metal fill material layer 46B is spaced from the insulating layers 32 and the memory stack structures 55 by the metallic barrier layer 46A, which is a metallic barrier layer that blocks diffusion of fluorine atoms therethrough.

During deposition of the metallic barrier layer 46A and the metallic fill material layer 46B in the backside recesses, the non-uniform inter-row spacing (d1, d2, d3, d4) facilitates diffusion of reactants for deposition of the conductive materials. Without wishing to be bound by a particular theory, it is believed that the conductive layer 46 material completely fills narrower spaces before completely filling wider spaces. Therefore, the wider gaps or spaces are formed closer to the backside trenches 79 and the narrower gaps or spaces are formed farther from the backside trenches 79. In this case, the wider outer spaces remain partially unfilled to provide an opening for the conductive layer 46 precursors provided from the trenches 79 to reach the middle inner portions of the arrays located farther from the trenches 79. This prevents voids from forming in the inner middle portions of the array. Specifically, the graded spacing causes complete filling of the gaps between the memory stack structures 55 in proximity to the vertical planes VP (i.e., away from the backside trenches 79) prior to complete filling of gaps between the memory stack structures 55 in proximity to the backside trenches 79 (i.e., away from the vertical planes VP). In other words, the sealing of gaps occurs gradually from the inner region of the vertical planes VP outward toward the backside trenches 79. Thus, a gap-free fill, or a fill with minimal gap volumes, can be achieved by the non-uniform inter-row spacing (d1, d2, d3, d4) of the present disclosure.

A plurality of electrically conductive layers 46 can be formed in the plurality of backside recesses 43, and a continuous metallic material layer 46L can be formed on the sidewalls of each backside contact trench 79 and over the contact level dielectric layer 73. Each electrically conductive layer 46 includes a portion of the metallic barrier layer 46A and a portion of the metal fill material layer 46B that are located between a vertically neighboring pair of dielectric material layers, which can be a pair of insulating layers 32, a bottommost insulating layer and a gate dielectric layer 12, or a topmost insulating layer and the insulating cap layer 70. The continuous metallic material layer 46L includes a continuous portion of the metallic barrier layer 46A and a continuous portion of the metal fill material layer 46B that are located in the backside trenches 79 or above the contact level dielectric layer 73.

Each sacrificial material layer 42 can be replaced with an electrically conductive layer 46. A backside cavity 79' is present in the portion of each backside contact trench 79 that is not filled with the backside blocking dielectric layer and the continuous metallic material layer 46L. A tubular dielectric spacer 116 laterally surrounds an epitaxial channel portion 11. A bottommost electrically conductive layer 46 laterally surrounds each tubular dielectric spacer 116 upon formation of the electrically conductive layers 46.

Figure 11:
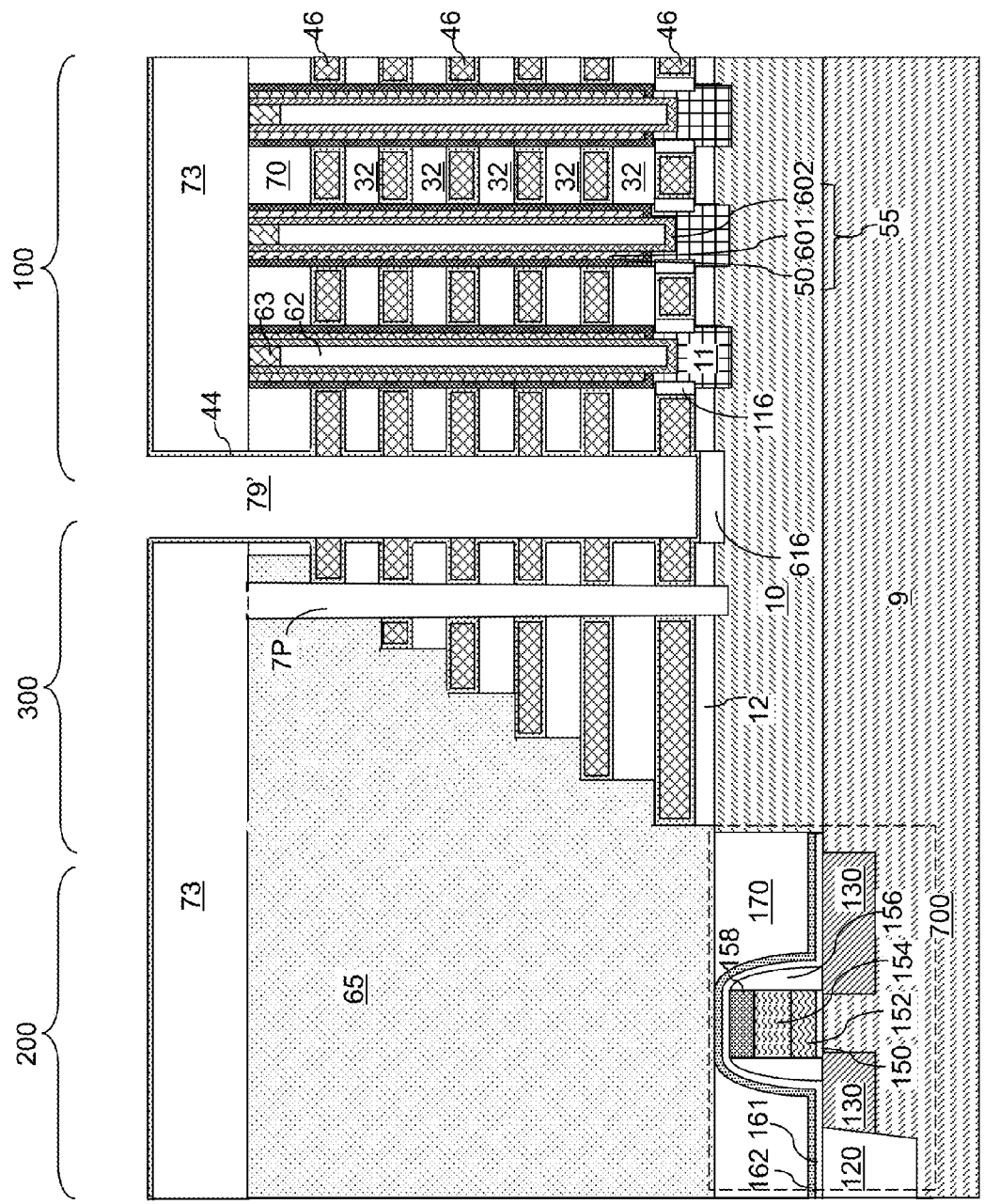
FIG. 11 is a schematic vertical cross-sectional view of the first exemplary structure after removal of a deposited conductive material from within the backside trench according to the first embodiment of the present disclosure.

Referring to FIG. 11, the deposited metallic material of the continuous electrically conductive material layer 46L is etched back from the sidewalls of each backside contact trench 79 and from above the contact level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

In one embodiment, the removal of the continuous electrically conductive material layer 46L can be selective to the material of the backside blocking dielectric layer 44. In this case, a horizontal portion of the backside blocking dielectric layer 44 can be present at the bottom of each backside contact trench 79. The gate dielectric layer 12 can be vertically spaced from the backside contact trench 79 by the horizontal portion of the backside blocking dielectric layer 44.

In another embodiment, the removal of the continuous electrically conductive material layer 46L may not be selective to the material of the backside blocking dielectric layer 44 or, the backside blocking dielectric layer 44 may not be employed. In this case, a top surface and/or sidewall surface, of the gate dielectric layer 12 can be physically exposed at the bottom of the backside contact trench 79 depending on whether the gate dielectric layer 12 is not removed or partially removed during removal of the continuous electrically conductive material layer 46L. In one embodiment, a top surface of the cap gate dielectric layer 126 can be physically exposed at the bottom of the backside contact trench 79 after removal of the continuous electrically conductive material layer 46L. A backside cavity 79' is present within each backside contact trench 79.

Figure 12A:
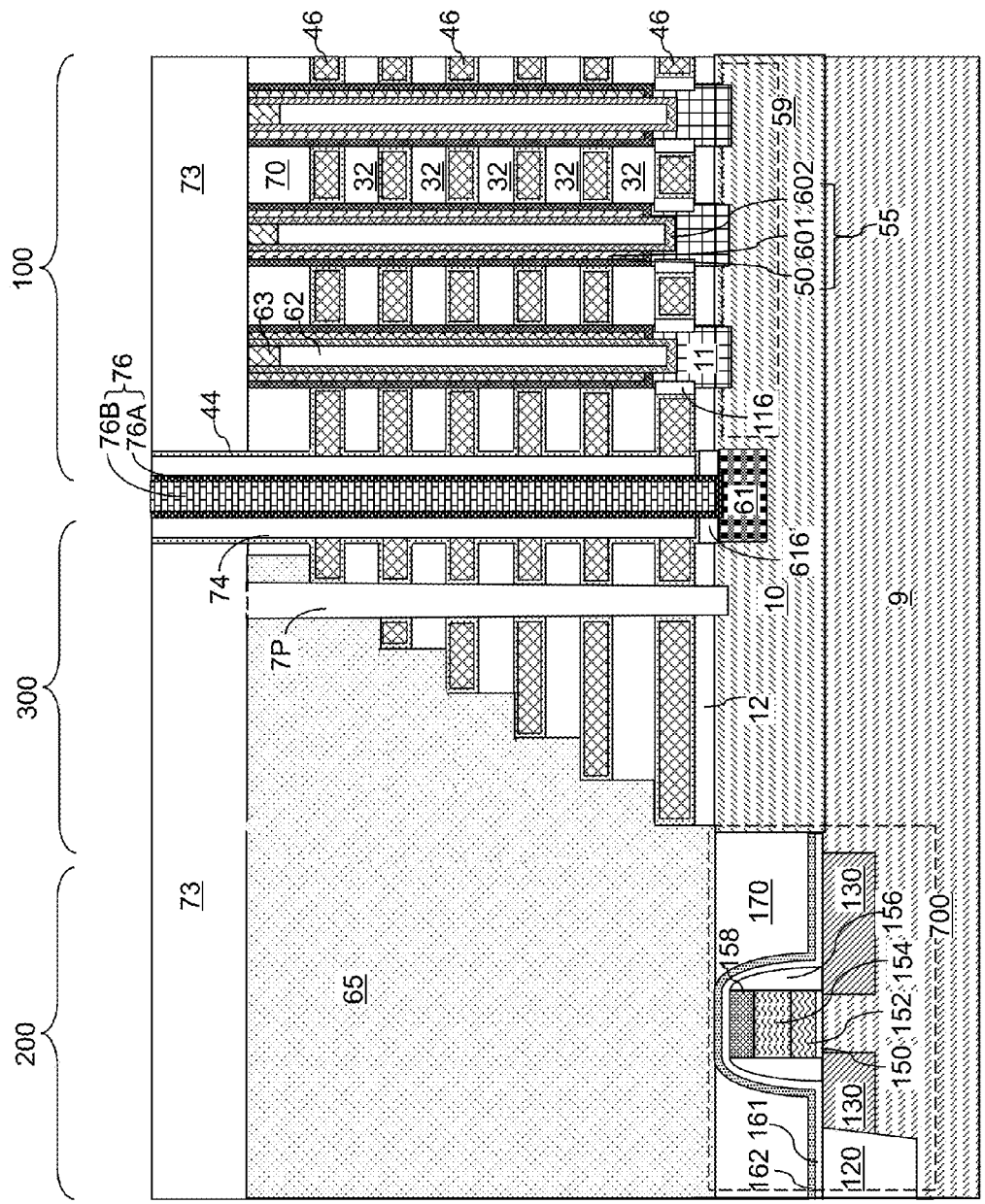
FIG. 12A is a schematic vertical cross-sectional view of the first exemplary structure after formation of an insulating spacer and a backside contact structure according to the first embodiment of the present disclosure.
Figure 12B:
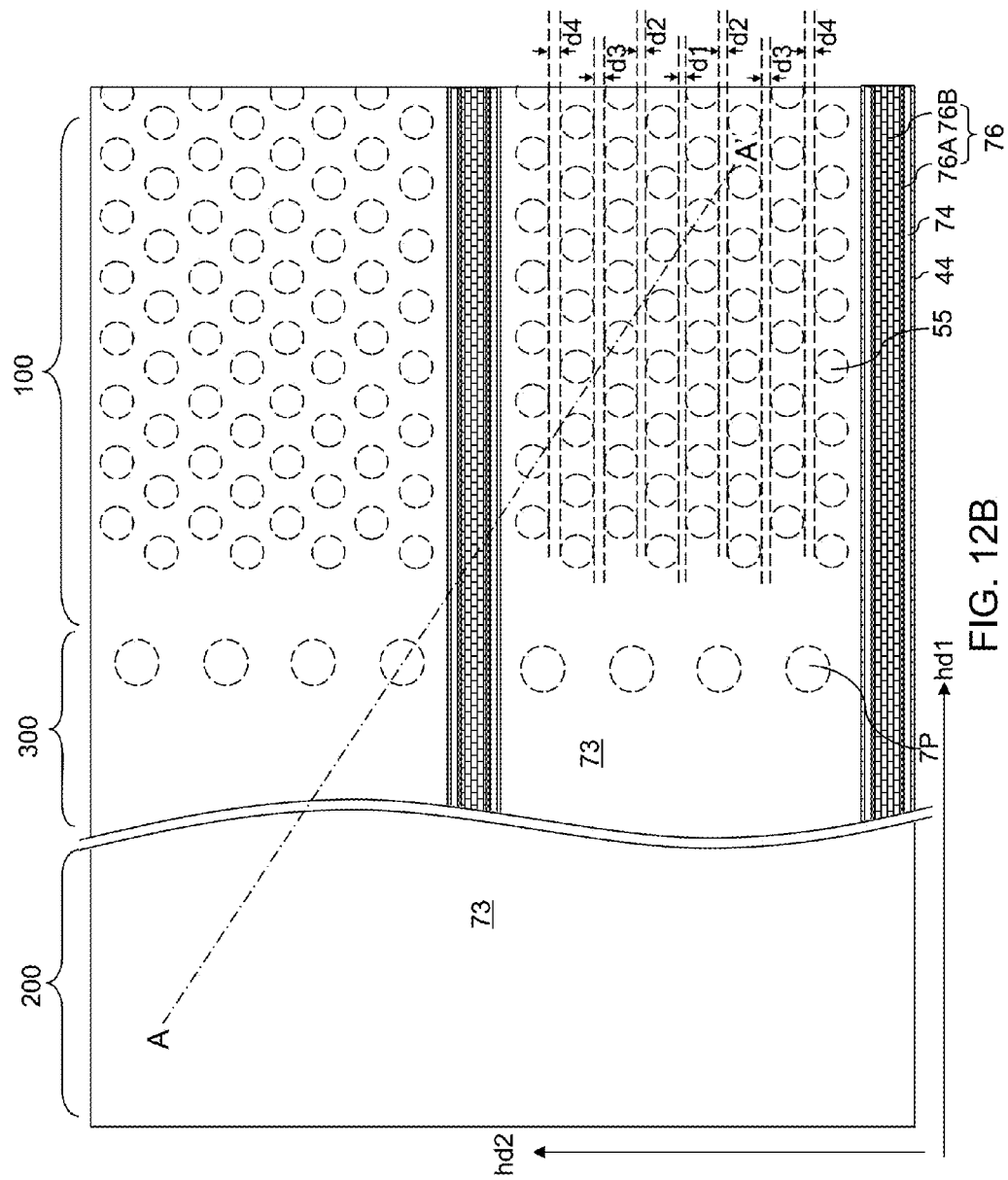
FIG. 12B is a top-down view of the first exemplary structure of FIG. 12A. The vertical plane A-A' is the plane of the schematic vertical cross-sectional view of FIG. 12A.
Figure 12C:
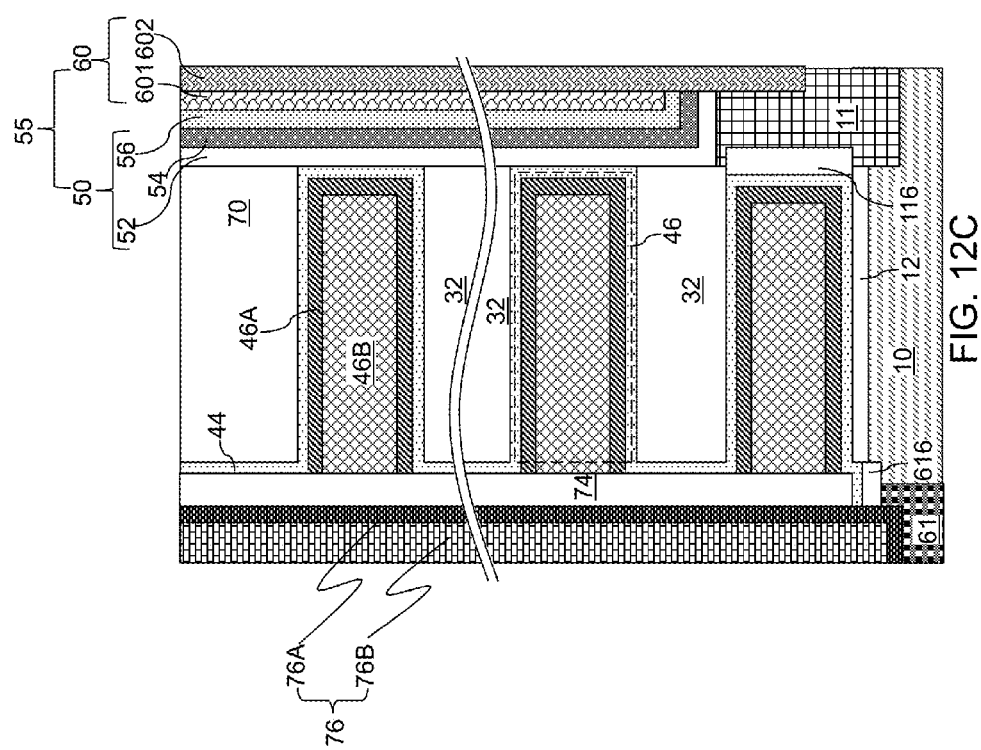
FIG. 12C is a magnified view of a region of the first exemplary structure of FIG. 12A.

Referring to FIGS. 12A-12C, an insulating material layer can be formed in the at least one backside contact trench 79 and over the contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

If a backside blocking dielectric layer 44 is present, the insulating material layer can be formed directly on surfaces of the backside blocking dielectric layer 44 and directly on the sidewalls of the electrically conductive layers 46. If a backside blocking dielectric layer 44 is not employed, the insulating material layer can be formed directly on sidewalls of the insulating layers 32 and directly on sidewalls of the electrically conductive layers 46.

An anisotropic etch is performed to remove horizontal portions of the insulating material layer from above the contact level dielectric layer 73 and at the bottom of each backside contact trench 79. Each remaining portion of the insulating material layer constitutes an insulating spacer 74. A backside cavity 79' is present within a volume surrounded by each insulating spacer 74.

The anisotropic etch process can continue with, or without, a change in the etch chemistry to remove portions of the optional backside blocking dielectric layer 44 and the planar dielectric portion 616 that underlies the opening through the insulating spacer 74. An opening is formed though the planar dielectric portion 616 underneath each backside cavity 79', thereby vertically extending the backside cavity 79'. A top surface of the semiconductor material layer 10 can be physically exposed at the bottom of each backside contact trench 79. The remaining portion of each planar dielectric portion 616 is herein referred to as an annular dielectric portion 616', which can include a dielectric oxide of the semiconductor material of the semiconductor material layer 10, have a uniform thickness, and an opening therethrough.

A source region 61 can be formed at a surface portion of the semiconductor material layer 10 under each backside cavity 79' by implantation of electrical dopants into physically exposed surface portions of the semiconductor material layer 10. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 can have a lateral extent greater than the lateral extent of the opening through the insulating spacer 74.

An upper portion of the semiconductor material layer 10 that extends between the source region 61 and the plurality of epitaxial channel portions 11 constitutes a horizontal semiconductor channel 59 for a plurality of field effect transistors. The horizontal semiconductor channel 59 is connected to multiple vertical semiconductor channels 60 through respective epitaxial channel portions 11. The horizontal semiconductor channel 59 contacts the source region 61 and the plurality of epitaxial channel portions 11. A bottommost electrically conductive layer 46 provided upon formation of the electrically conductive layers 46 within the alternating stack (32, 46) can comprise a select gate electrode for the field effect transistors. Each source region 61 is formed in an upper portion of the semiconductor substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

A contact via structure 76 can be formed within each cavity 79'. Each contact via structure 76 can fill a respective cavity 79'. The contact via structures 76 can be formed by depositing at least one conductive material in the remaining unfilled volume (i.e., the backside cavity 79') of the backside contact trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact level dielectric layer 73 overlying the alternating stack (32, 46) as a stopping layer. If chemical mechanical planarization (CMP) process is employed, the contact level dielectric layer 73 can be employed as a CMP stopping layer. Each remaining continuous portion of the at least one conductive material in the backside contact trenches 79 constitutes a backside contact via structure 76.

The backside contact via structure 76 extends through the alternating stack (32, 46), and contacts a top surface of the source region 61. If a backside blocking dielectric layer 44 is employed, the backside contact via structure 76 can contact a sidewall of the backside blocking dielectric layer 44.

Figure 13A:
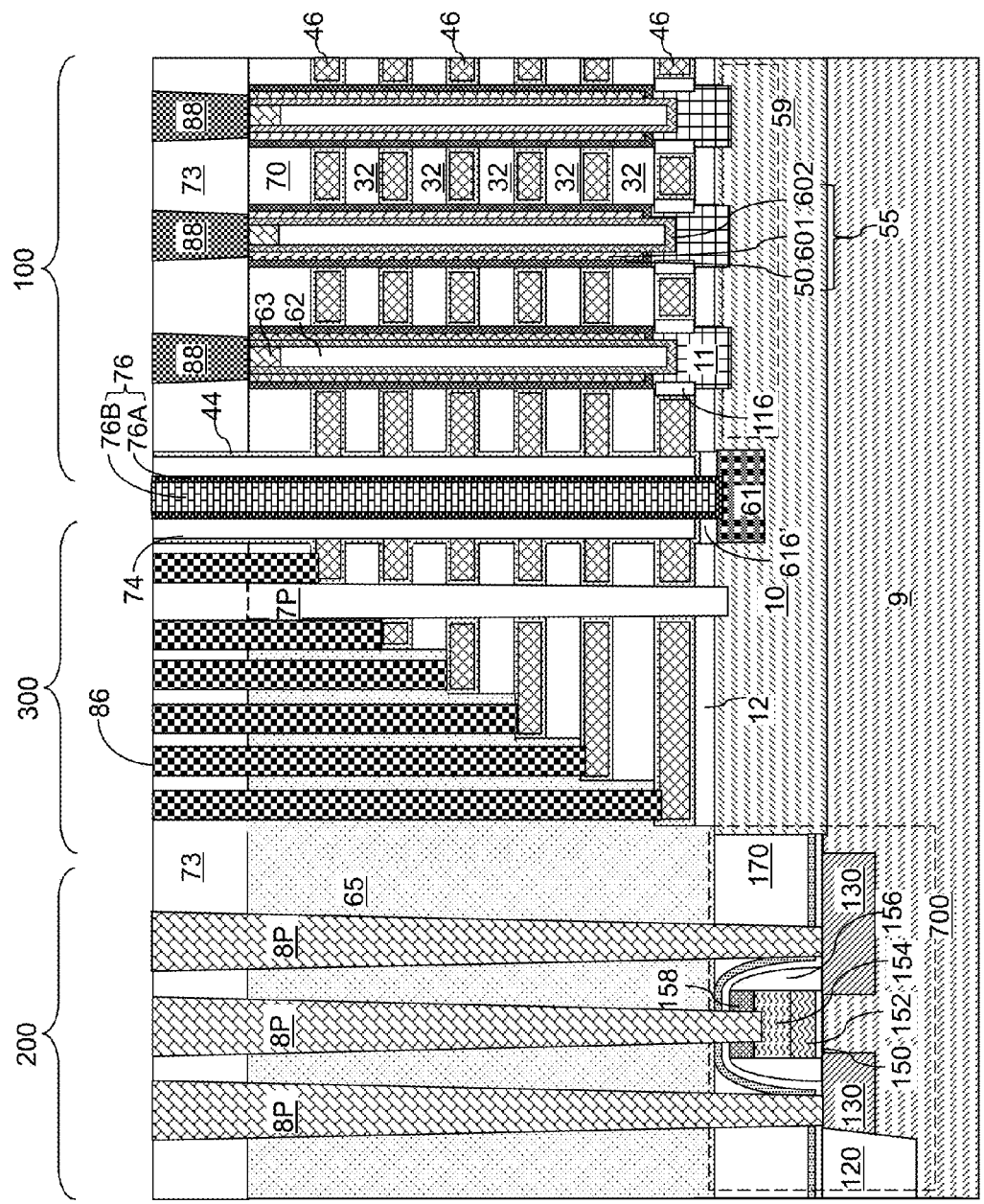
FIG. 13A is a schematic vertical cross-sectional view of the first exemplary structure after formation of additional contact via structures according to the first embodiment of the present disclosure.
Figure 13B:
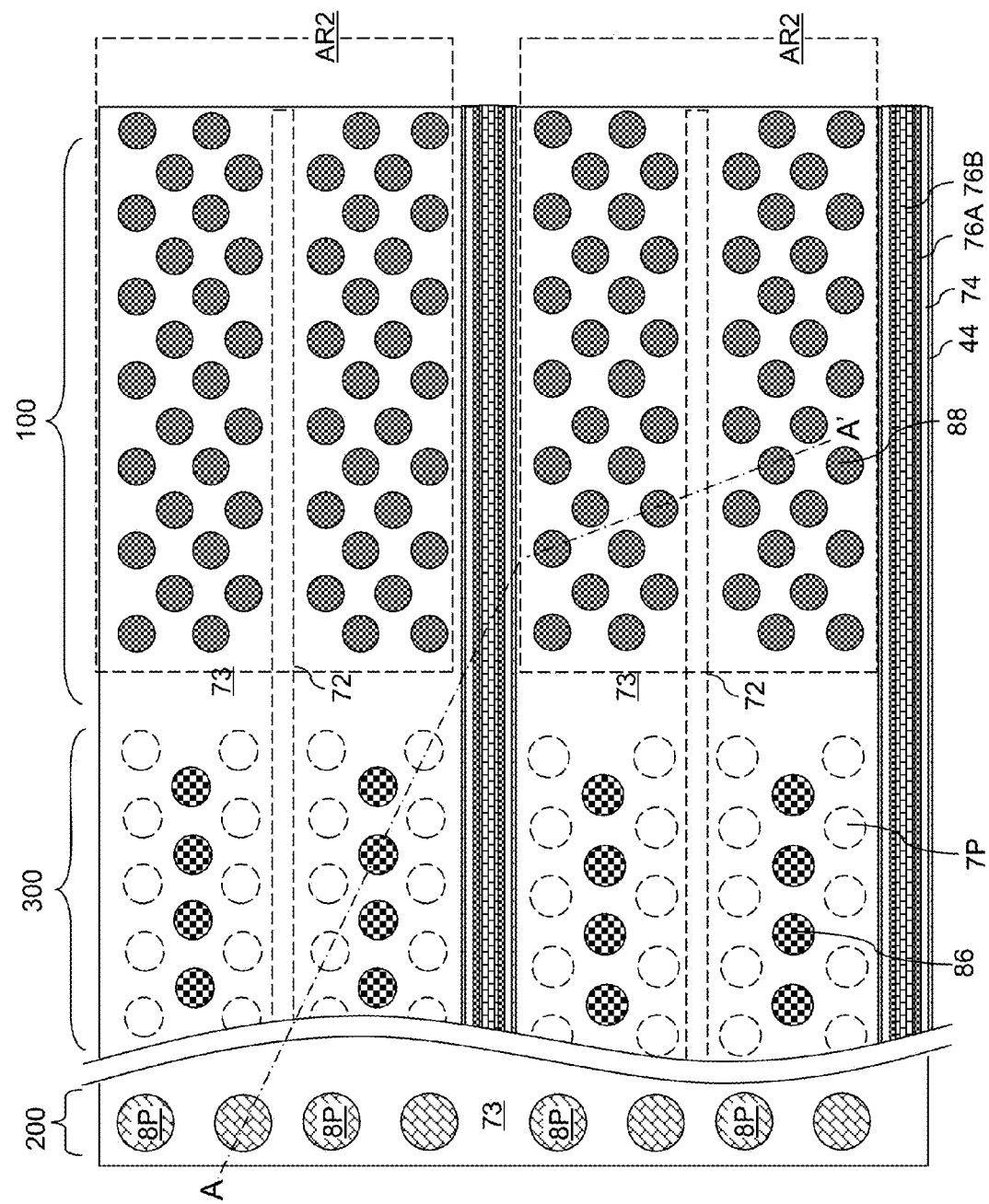
FIG. 13B is a top-down view of the first exemplary structure of FIG. 13A. The vertical plane A-A' is the plane of the schematic vertical cross-sectional view of FIG. 13A.

Referring to FIGS. 13A and 13B, additional contact via structures (88, 86, 8P) can be formed through the contact level dielectric layer 73, and optionally through the retro-stepped dielectric material portion 65. For example, drain contact via structures 88 can be formed through the contact level dielectric layer 73 on each drain region 63. The drain contact via structures 88 electrically connect the drain regions 63 to bit lines that will be described below with respect to FIG. 21. Word line contact via structures 86 can be formed on the electrically conductive layers 46 through the contact level dielectric layer 73, and through the retro-stepped dielectric material portion 65. Peripheral device contact via structures 8P can be formed through the retro-stepped dielectric material portion 65 directly on respective nodes of the peripheral devices. The drain select level isolation structures 72 can be formed through the upper part of the alternating stack (32, 46) as will be described in more detail below with respect to FIG. 17A.

The first exemplary structure can include a three-dimensional memory device. The three-dimensional memory device can include an alternating stack (32, 46) of insulating layers 32 and electrically conductive layers 46 located over a substrate (9, 10), and memory stack structures 55 extending through the alternating stack (32, 46). Each of the memory stack structures 55 comprises a memory film 50 and a vertical semiconductor channel 60. The memory stack structures 55 are arranged in at least one two-dimensional array AR2. Memory stack structures 55 within each of the at least one two-dimensional array AR2 have a uniform pitch p0 along a uniform pitch horizontal direction (such as the first horizontal direction hd1) and a non-uniform pitch along a non-uniform pitch horizontal direction (such as a second horizontal direction hd2) that is perpendicular to the uniform pitch horizontal direction.

In one embodiment, the three-dimensional memory device can further include a pair of backside trenches 79 horizontally extending along a lengthwise direction. The at least one two-dimensional array AR2 of the memory stack structures 55 can be located between the pair of backside trenches 79. In one embodiment, each backside trench 79 includes a respective insulating spacer 74 and a backside contact via structure 76 that contacts a region (such as a source region 61) within the substrate (9, 10).

The uniform pitch horizontal direction can be parallel to the lengthwise direction of the pair of backside trenches, and the non-uniform pitch horizontal direction can be perpendicular to the lengthwise direction of the pair of backside trenches. In one embodiment, the at least one two-dimensional array AR2 can be a single two-dimensional array AR2 that includes rows of one-dimensional periodic arrays AR1 having the uniform pitch P0, and the rows of one-dimensional periodic arrays AR1 can have a non-uniform inter-row spacing (d1, d2, d3, d4) along the non-uniform pitch horizontal direction (such as the second horizontal direction hd2). In one embodiment, the first horizontal direction hd1 may be the word line direction (i.e., parallel to the direction in which the word lines 46 extend) and the second horizontal direction hd2 may be a bit line direction (i.e., parallel to the direction in which the bit lines 108 shown in FIG. 21 extend). The electrically conductive layers 46 may comprise word lines (e.g., control gate portions of the word lines) or select gate electrodes (depending on their location in the stack) of a vertical NAND device. Each two-dimensional array AR2 can have the same width as a word line or control gate electrode (e.g., drain side select gate electrode) between the backside trenches 79 and/or isolation structures 72 and can extend in the word line direction (i.e., have longer sides in the word line direction than in the bit line direction).

In one embodiment, the non-uniform inter-row spacing (d1, d2, d3, d4) can be at a minimum for a pair of rows that is most proximal to a vertical plane VP that is equidistant from the pair of nearest neighbor backside trenches 79. In one embodiment, the non-uniform inter-row spacing (d1, d2, d3, d4) increases with a lateral distance LD from the vertical plane VP that is equidistant from the pair of backside trenches 79 toward either of the pair of the backside trenches 79.

In one embodiment, the alternating stack (32, 46) comprises a terrace region in which each electrically conductive layer 46 other than a topmost electrically conductive layer 46 within the alternating stack (32, 46) laterally extends farther than any overlying electrically conductive layer 46 within the alternating stack (32, 46). The terrace region includes stepped surfaces of the alternating stack (32, 46) that continuously extend from a bottommost layer 46 within the alternating stack (32, 46) to a topmost layer within the alternating stack (32, 46).

Figure 14A:
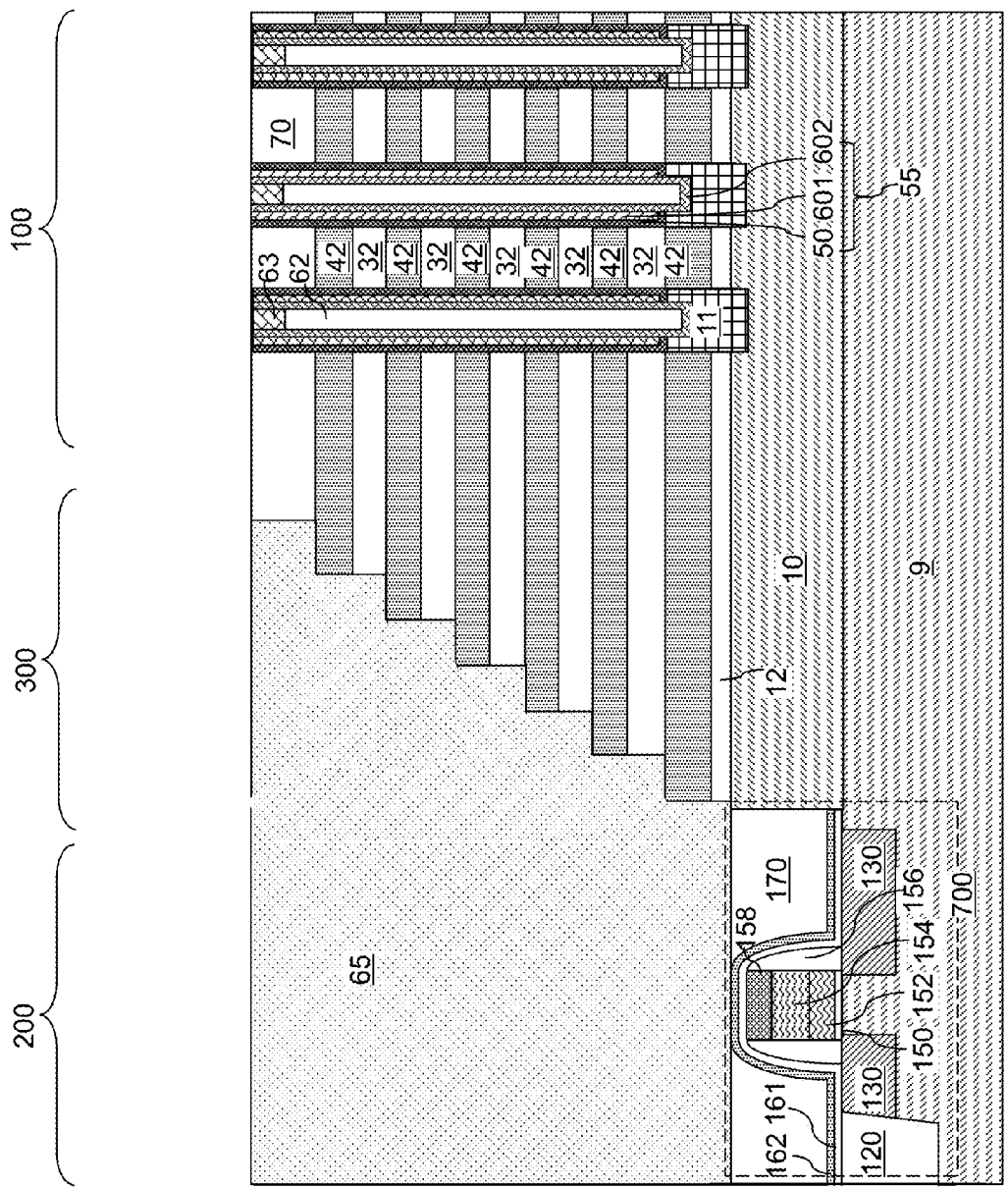
FIG. 14A is a vertical cross-sectional view of a second exemplary structure after formation of memory stack structures according to a second embodiment of the present disclosure.
Figure 14B:
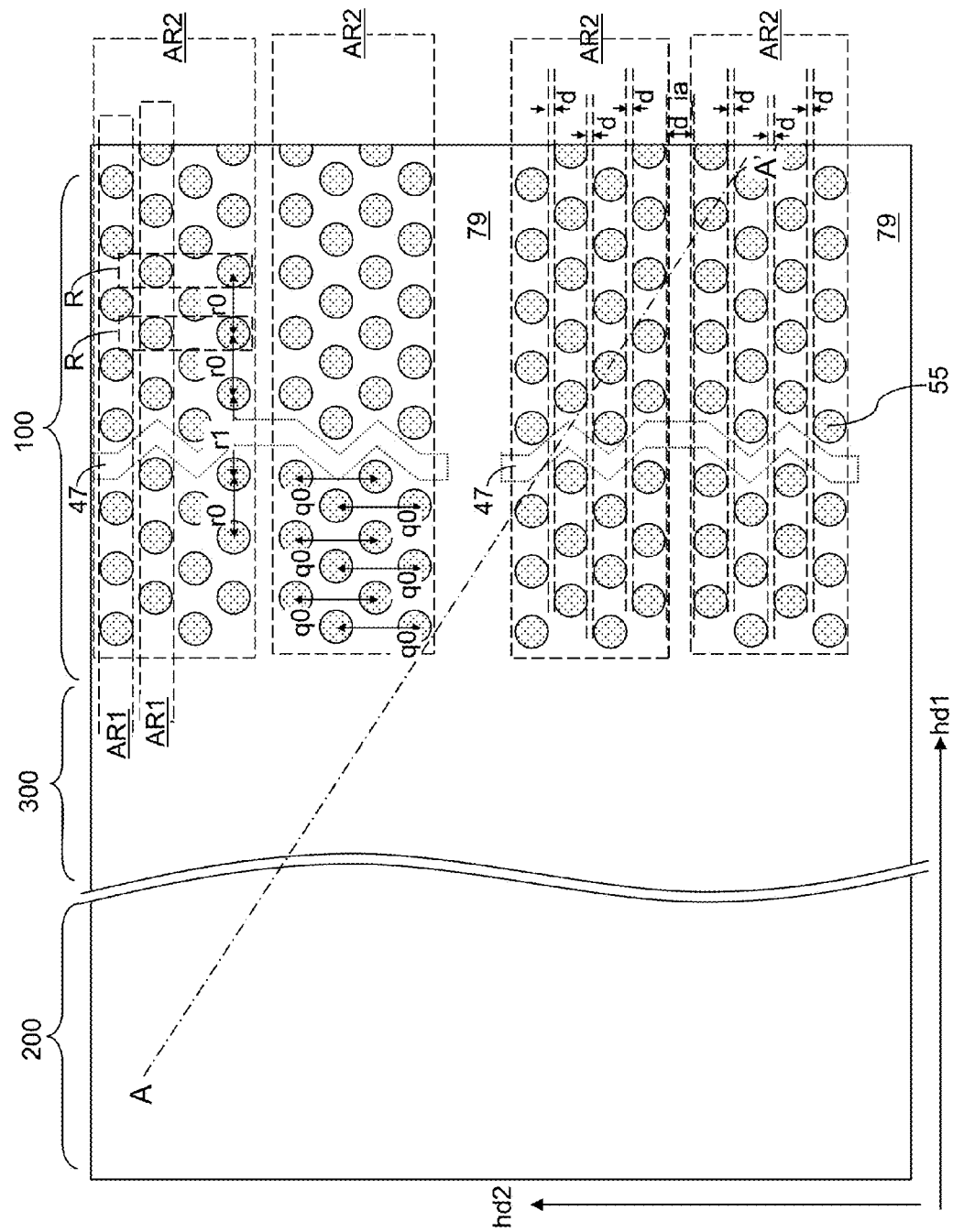
FIG. 14B is a top-down view of the second exemplary structure of FIG. 14A. The vertical plane A-A' is the plane of the schematic vertical cross-sectional view of FIG. 14A.

Referring to FIGS. 14A and 14B, a second exemplary structure according to a second embodiment of the present disclosure is shown, which can be derived from the first exemplary structure of FIGS. 6A and 6B by altering the pattern of arrangement of the memory openings 49, and consequently, the pattern of arrangement of the memory stack structures 55.

In one embodiment, the memory stack structures 55 can be arranged in at least one two-dimensional array AR2. The at least one two-dimensional array AR2 can be a plurality of two-dimensional arrays AR2 that are laterally spaced apart along a horizontal direction such as the second horizontal direction hd2. In one embodiment, the memory stack structures 55 within each of the at least one two-dimensional array AR2 (which can be a plurality of two-dimensional arrays AR2) can have a uniform pitch q0 along a uniform pitch horizontal direction (such as the second horizontal direction hd2) and a non-uniform pitch (r0, r1) along a non-uniform pitch horizontal direction (such as the first horizontal direction hd1).

In one embodiment, the at least one two-dimensional array AR2 can include a plurality of two-dimensional arrays that are laterally spaced along a horizontal direction (such as the second horizontal direction hd2), and each of the plurality of two-dimensional arrays AR2 includes respective rows R of memory stack structures 55 that extend along the uniform pitch horizontal direction (such as the second horizontal direction hd2). While the one-dimensional array of memory stack structures 55 is referred to as a row, R, it may also be referred to as a column depending on the direction in which the device is viewed. An inter-row (or inter-column) spacing (r0, r1) (i.e., pitch), as measured between a neighboring pair of memory stack structures 55 spaced along the first horizontal direction hd1, within each two-dimensional array AR2 can have a modulation along the non-uniform pitch direction (such as the first horizontal direction hd1). In one embodiment, the non-uniform pitch (r0, r1) can consist of a first pitch r0 that is consecutively repeated at least twice at each occurrence, and a second pitch r1 that is greater than the first pitch r0 and occurs only in isolated instances between instances of the first pitch r0. For example, the second pitch r1 can be greater than the first pitch r0 by at least 5%, such as 5 to 20%, for example 5 to 10%.

Areas in which the second pitch r1 occur can be continuously connected along the uniform pitch horizontal direction (such as the second horizontal direction hd2) to form a channel space region 47. It should be noted that with reference to region 47, the term "channel" refers to a precursor flow channel rather than to a channel region of a transistor or memory string. Each channel space region 47 extends through at least one two-dimensional array AR2. In one embodiment, a channel space region 47 can extend through multiple two-dimensional arrays AR2 along the second horizontal direction hd2 or in a roughly zig-zag pattern that extends primarily (i.e., by greater than 50%) in the second horizontal direction hd2.

In one embodiment, each two-dimensional array AR2 can include a plurality of one-dimensional arrays AR1 that extend along the non-uniform pitch horizontal direction (such as the first horizontal direction hd1). The spacing d between each neighboring pair of one-dimensional arrays AR1 within a two-dimensional array AR2 can be the same throughout the two-dimensional array AR2. In an alternative configuration, the pitch varies along both the first and the second horizontal directions, hd1 and hd2. In other words, the configuration of the first embodiment is combined with the configuration of the second embodiment. The inter-array spacing d_ia between pairs of one-dimensional arrays AR1 belonging to different two-dimensional arrays AR2 can be greater than the spacing d between each neighboring pair of one-dimensional arrays AR1 within a same two-dimensional array AR2.

Figure 15A:
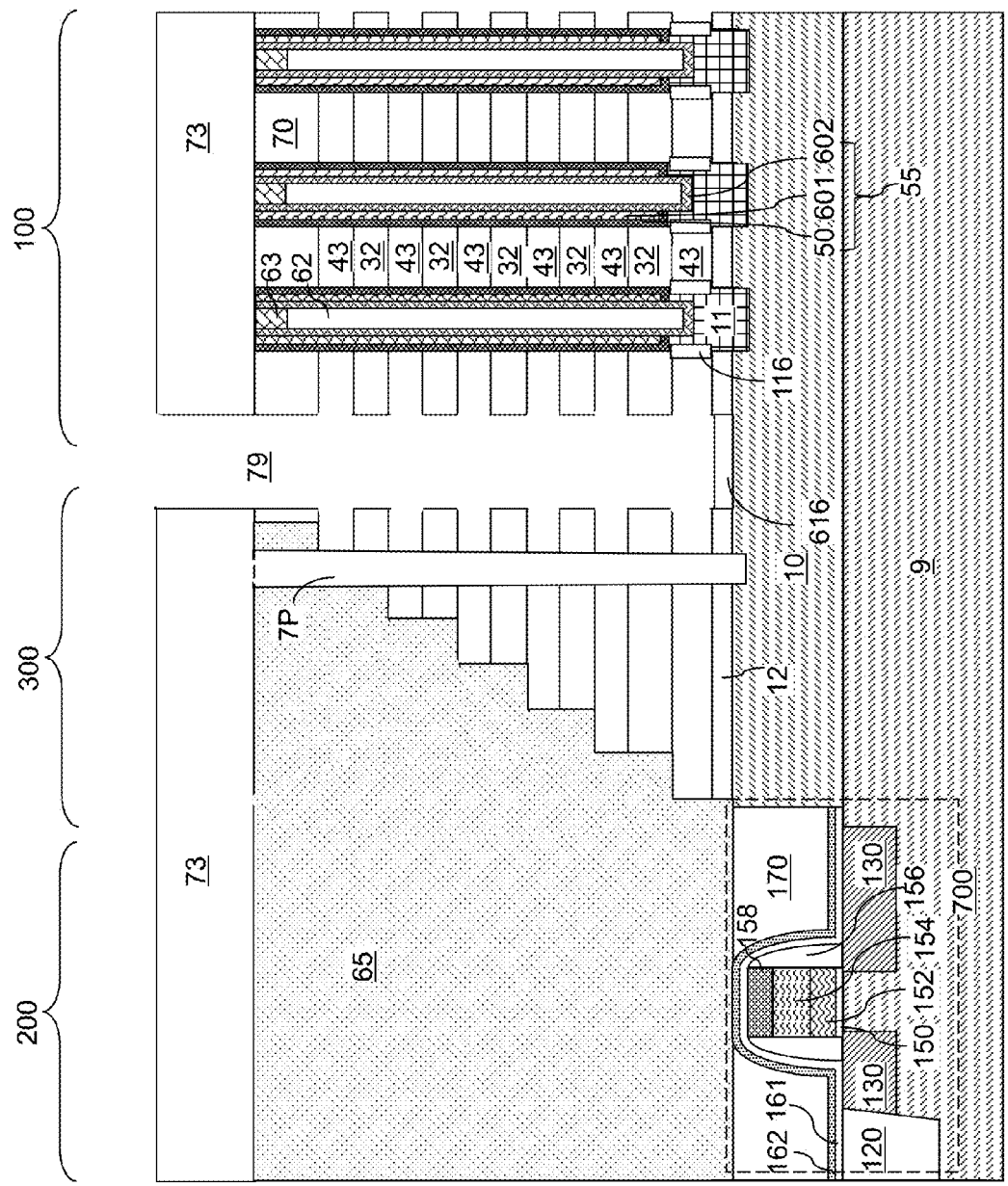
FIG. 15A is a schematic vertical cross-sectional view of the second exemplary structure after formation of backside recesses according to the second embodiment of the present disclosure.
Figure 15B:
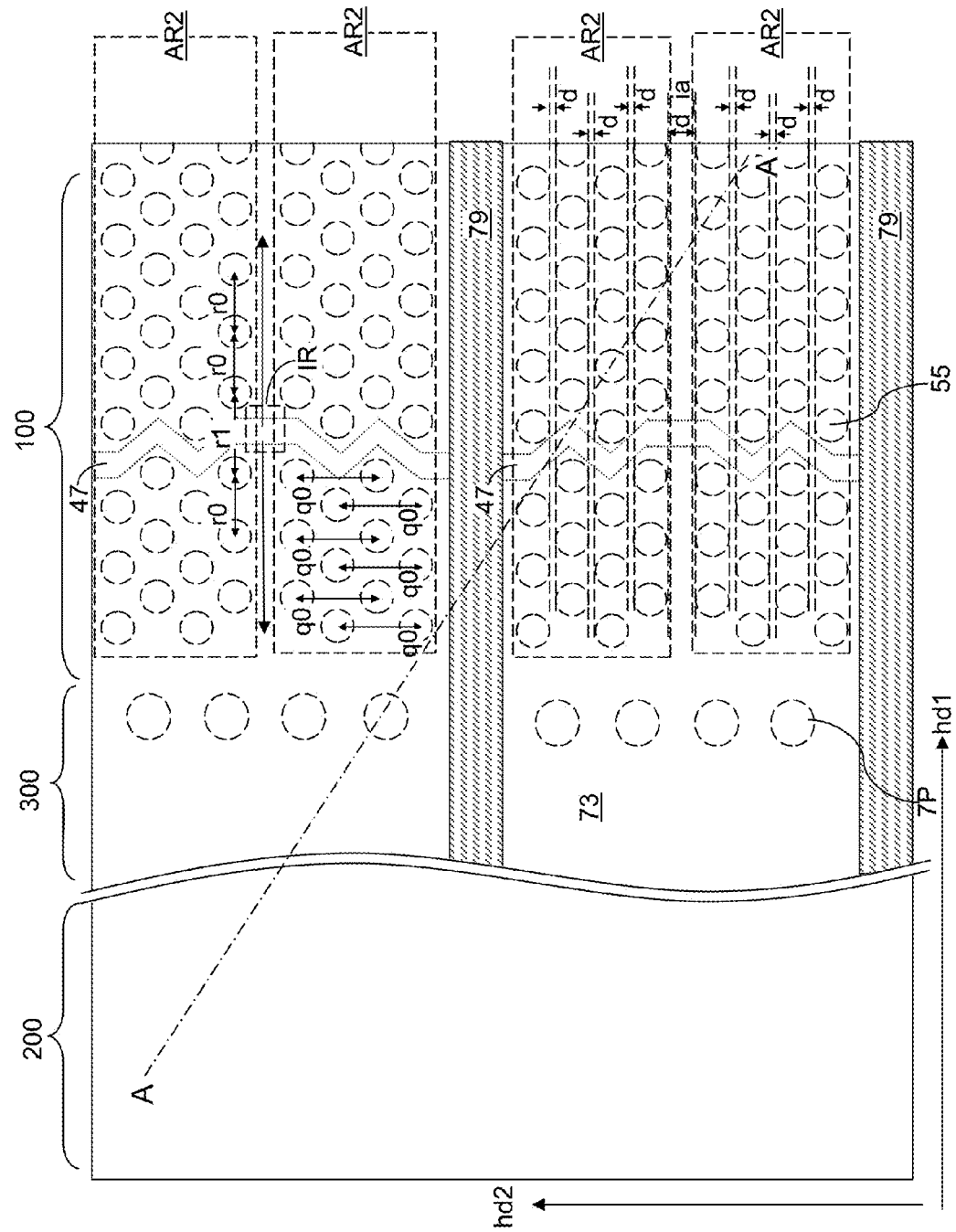
FIG. 15B is a top-down view of the second exemplary structure of FIG. 15A. The vertical plane A-A' is the plane of the schematic vertical cross-sectional view of FIG. 15A.

Referring to FIGS. 15A and 15B, the processing steps of FIGS. 7A, 7B, and 8 can be performed as in the first embodiment. Specifically, dielectric support pillars 7P (or support pillar structures) and a contact level dielectric layer 73 can be formed. Backside trenches 79 that horizontally extend along a lengthwise direction (such as the first horizontal direction hd1) can be formed through the contact level dielectric layer 73 and the alternating stack (32, 42). In one embodiment, the lengthwise direction of the backside trenches 79 can be parallel to the non-uniform pitch horizontal direction, i.e., the first horizontal direction hd1. At least one two-dimensional array AR2 of the memory stack structures 55 can be provided between each neighboring pair of backside trenches 79. In one embodiment, the uniform pitch horizontal direction (i.e., the second horizontal direction hd2) can be perpendicular to the lengthwise direction of the pair of backside trenches 79, and the non-uniform pitch horizontal direction (i.e., the first horizontal direction hd1) can be parallel to the lengthwise direction of the pair of backside trenches 79. Subsequently, backside recesses 43 can be formed by removing the sacrificial material layers 42.

Figure 16:
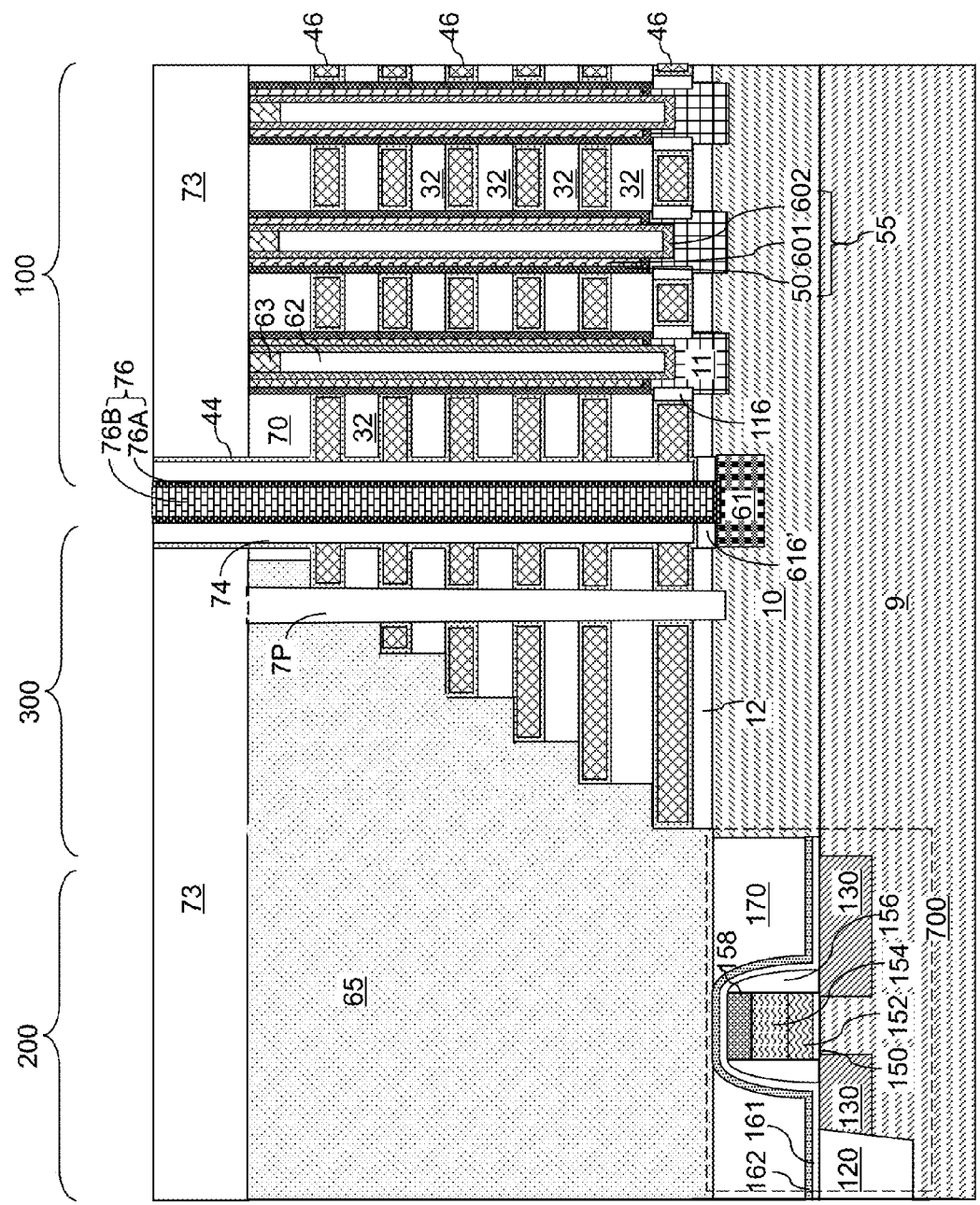
FIG. 16 is a schematic vertical cross-sectional view of the second exemplary structure after formation of an insulating spacer and a backside contact structure according to the second embodiment of the present disclosure.

Referring to FIG. 16, the processing steps of FIGS. 9A-9C, 10, 11, and 12A-12C can be performed to form a backside blocking dielectric layer 44, electrically conductive layers 46, source regions 61, insulating spacers 74, and backside contact via structures 76. During deposition of the metallic barrier layer 46A and the metallic fill material layer 46B in the backside recesses, the channel space region 47 provides a channel through which the reactants for deposition of electrically conductive material can flow through. For example, $WF_6$ can flow through region 47 to deposit tungsten electrically conductive layers (e.g., word lines 46). Specifically, the reactants can flow from the backside trenches 79 though the channel space regions 47 to intersection regions IR (shown in FIG. 15B) at which the channel space regions 47 intersect a gap between a neighboring pair of two-dimensional array AR2 of memory stack structures 55. The reactants can then move from the intersection regions IR along the lengthwise direction of the gap between each neighboring pairs of two-dimensional arrays AR2 of memory stack structures 55. As in the first embodiment, the narrower spaces are completely filled with electrically conductive layer 46 material before the wider spaces. Thus, wider regions 47 with pitch r1 are only partially filled when the narrower spaces with pitch r0 between the memory stack structures 55 are completely filled. Therefore, the partially filled regions 47 provide a channel for the precursors to flow to regions distal from the backside trenches 79.

Thus, the plurality of channel space regions 47 are free of memory stack structures 55 and extend through a region having the wider second pitch r1. The precursors for the electrically conductive layers 46 flow from the pair of backside trenches 77 through wider, partially filled channel space regions 47 to fully fill the narrower spaces between memory stack structures 55 in a region having the narrower first pitch r0.

Figure 17A:
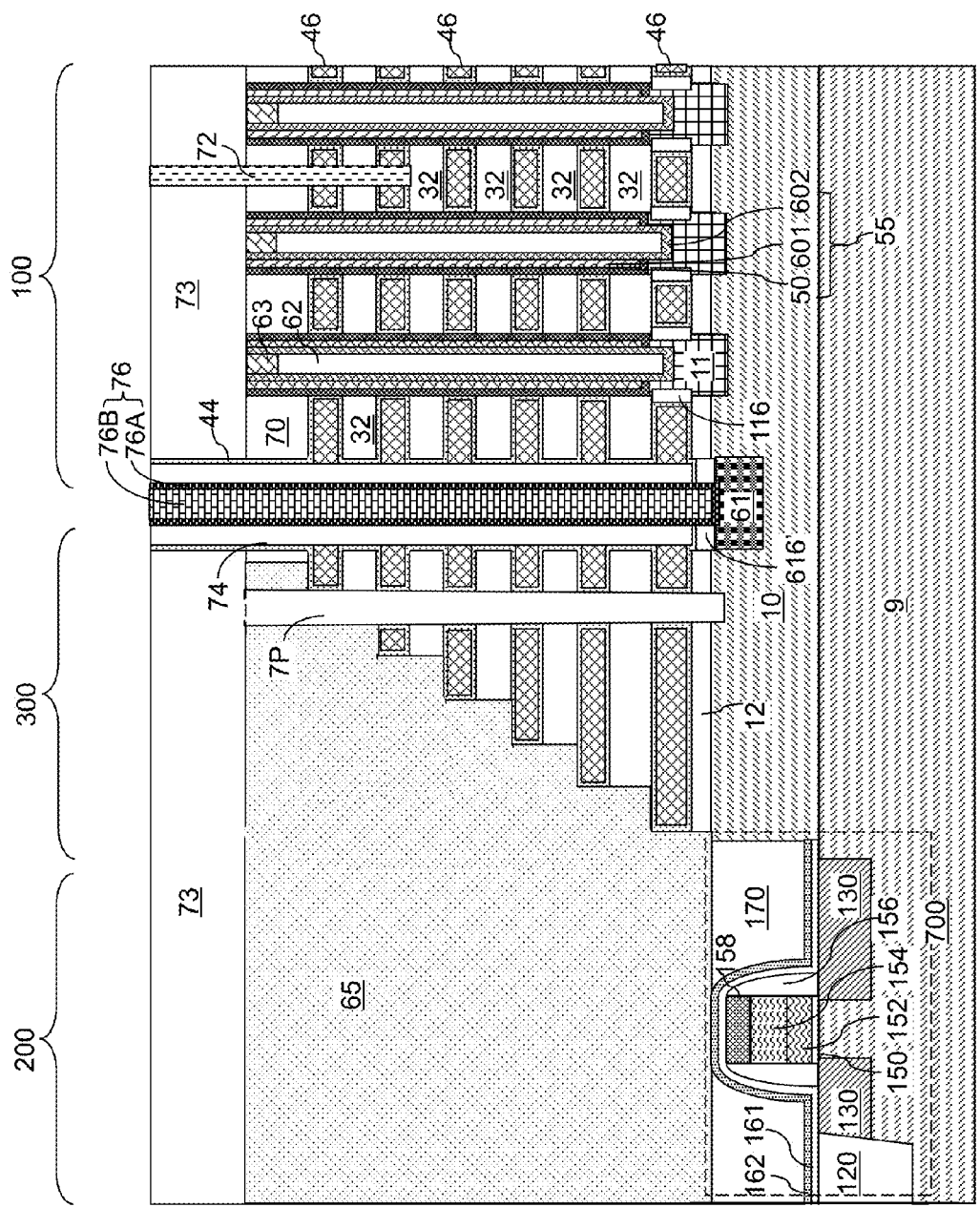
FIG. 17A is a vertical cross-sectional view of the second exemplary structure after formation of drain select level isolation structures according to an embodiment of the present disclosure.
Figure 17B:
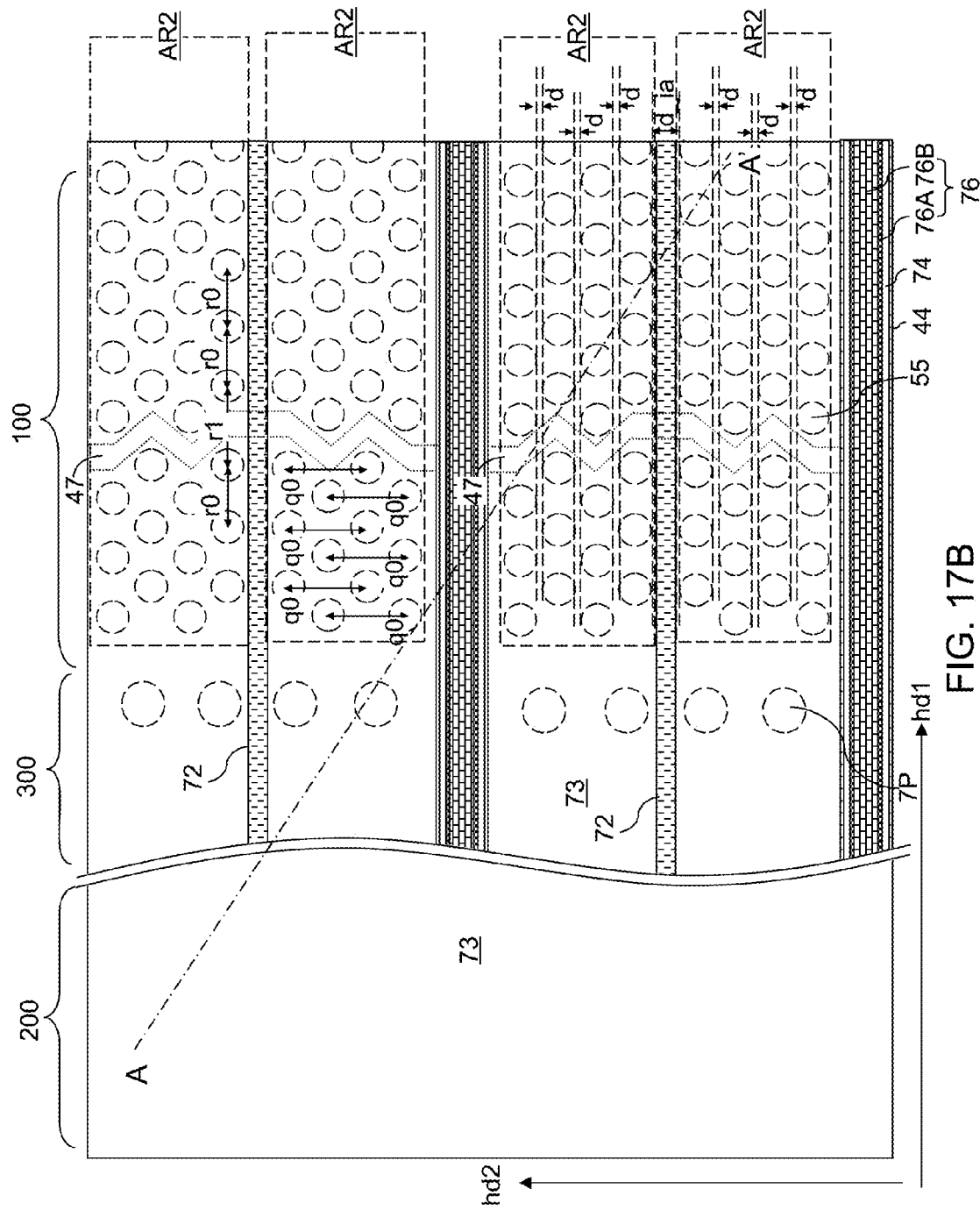
FIG. 17B is a top-down view of the second exemplary structure of FIG. 17A. The vertical plane A-A' is the plane of the schematic vertical cross-sectional view of FIG. 17A.

Referring to FIGS. 17A and 17B, a photoresist layer (not shown) can be applied over the contact level dielectric layer 73 and lithographically patterned to form openings that overlie regions between neighboring pairs of two-dimensional arrays AR2 of memory stack structures 55 that are not separated by backside trenches 79 (and the backside contact via structures 76 therein). An anisotropic etch is performed to transfer the pattern of the openings through the contact level dielectric layer 73 and each electrically conductive layer 46 located at drain select gate levels. As used herein, a drain select gate level refers to a level at which a drain select gate is provided. A drain select gate refers to a gate that determines selection or non-selection of a vertical semiconductor channel 60 from the drain side, i.e., the side of the drain regions 63. Any intervening insulating layer 32 between the electrically conductive layers 46 at drain select levels can be etched through. The trenches formed by the anisotropic etch are herein referred to as drain select level trenches.

The photoresist layer is subsequently removed, for example, by ashing. The drain select level trenches are filled with a dielectric material to form drain select level isolation structures 72. Each drain select level isolation structure 72 extends through the contact level dielectric layer 73, electrically conductive layers 46 at the drain select levels (i.e., drain side select gate electrodes), and insulating layers 32 between these electrically conductive layers 46. The drain select level isolation structures 72 do not extend into electrically conductive layers 46 (i.e., word lines and source side select gate electrodes) below the bottommost drain select level. The memory stack structures 55 are preferably not formed under the drain select level isolation structures 72.

Figure 17C:
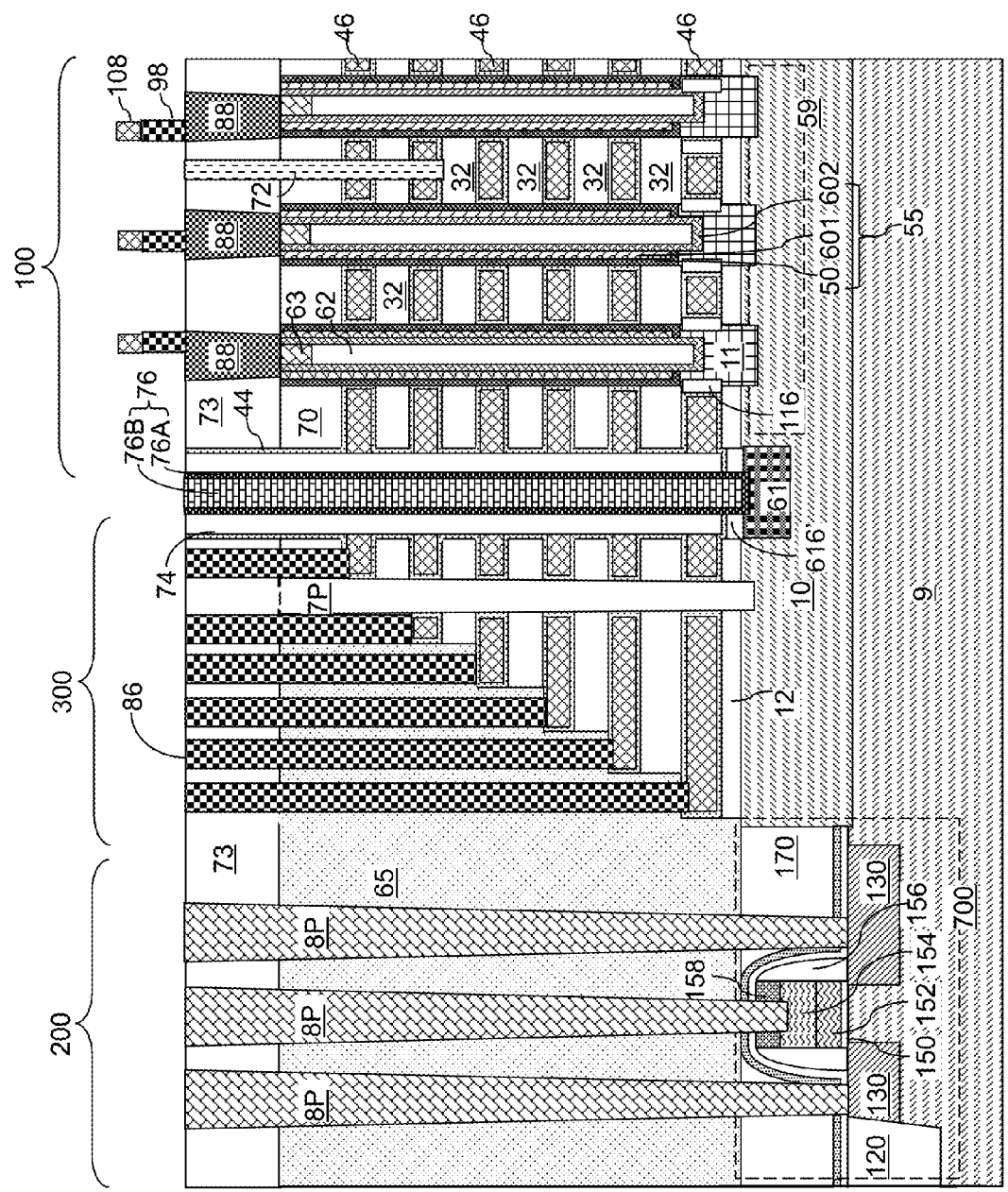
FIG. 17C is a vertical cross-sectional view of the second exemplary structure after formation of via contact structures and bit lines.

Subsequently, as shown in FIG. 17C, the processing steps of FIGS. 13A and 13B can be performed to form various additional contact via structures (88, 86, 8P) in the same manner as in the first embodiment. Optional array contact via structures 98 are formed on the drain contact via structures 88, and the bit lines 108 are formed on the array contact via structures 98. The bit lines 108 electrically contact the respective drain regions 63 through the contact structures 88 and/or 98. The interlayer insulating layer(s) located around structures 98 and bit lines 108 are not shown for clarity.

Referring to FIG. 18, a first alternative configuration for the second exemplary structure is illustrated, which can be derived from the second exemplary structure of FIGS. 17A and 17B by forming the channel space regions 47 in a staggered manner. In this case, each channel space region 47 can laterally extend primarily along a direction (e.g., hd2) perpendicular to the lengthwise direction of the backside trenches 79 (such as the uniform pitch horizontal direction hd2) by a lesser distance than the lateral distance between a neighboring pair of backside trenches 79. Thus, the locations of the channel space regions 47 in one two-dimensional array AR2 is offset (i.e., staggered) from the locations of the channel space regions 47 in an adjacent two-dimensional array AR2. This configuration provides a shorter path for the precursors (i.e., reactants) to reach portions under the drain select level isolation structures 72.

Figure 19:
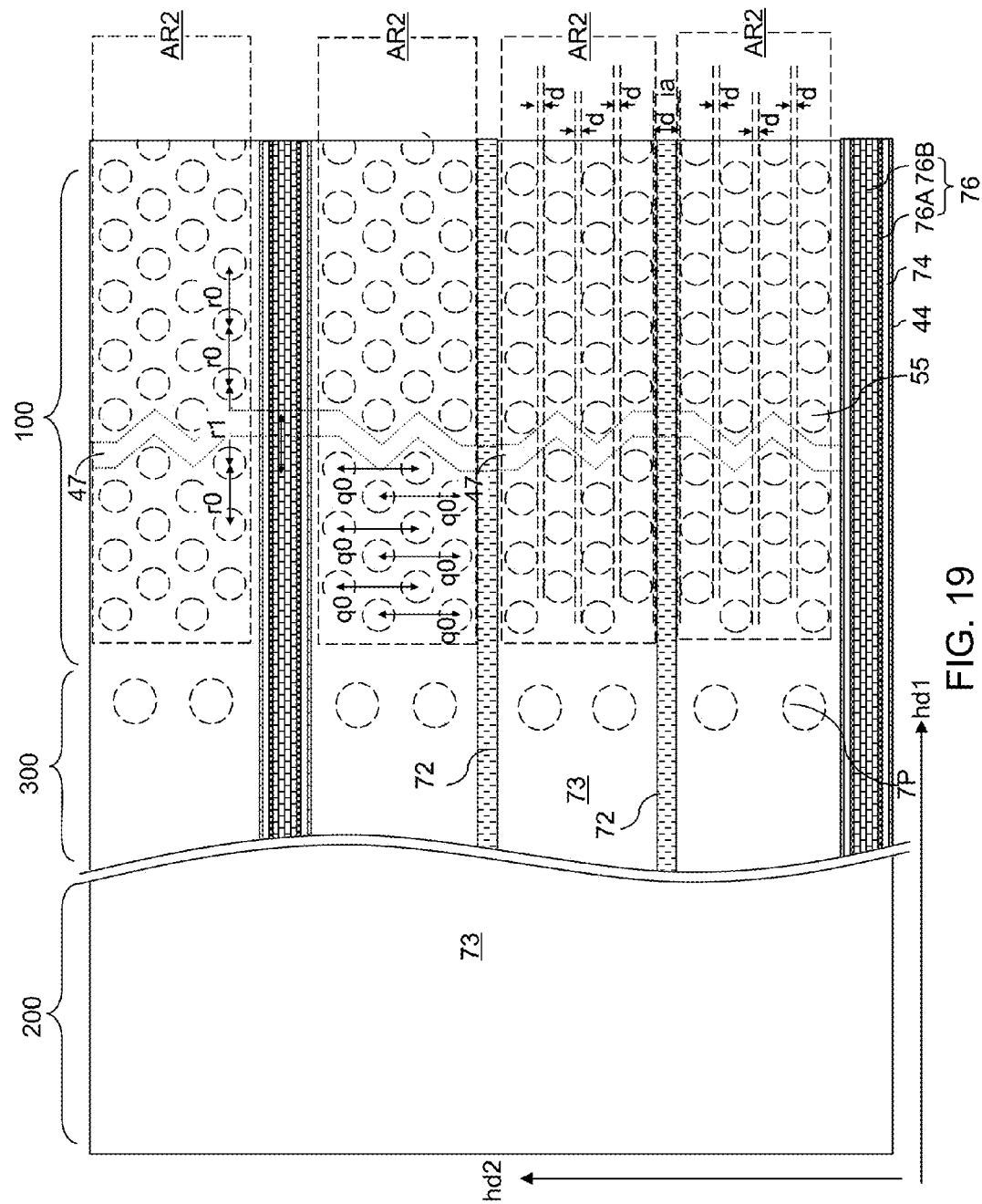
FIG. 19 is a second alternative configuration for the second exemplary structure according to the second embodiment of the present disclosure.

Referring to FIG. 19, a second alternative configuration for the second exemplary structure is illustrated, which can be derived from the second exemplary structure of FIGS. 17A and 17B by forming three or more two-dimensional arrays AR2 of memory stack structures 55 separated by the drain level isolation structures 72 between a neighboring pair of backside trenches 79. The channel space regions 47 may extend between a pair of backside trenches 79, or may be arranged in a staggered manner. This structure provides a higher device density.

Figure 20:
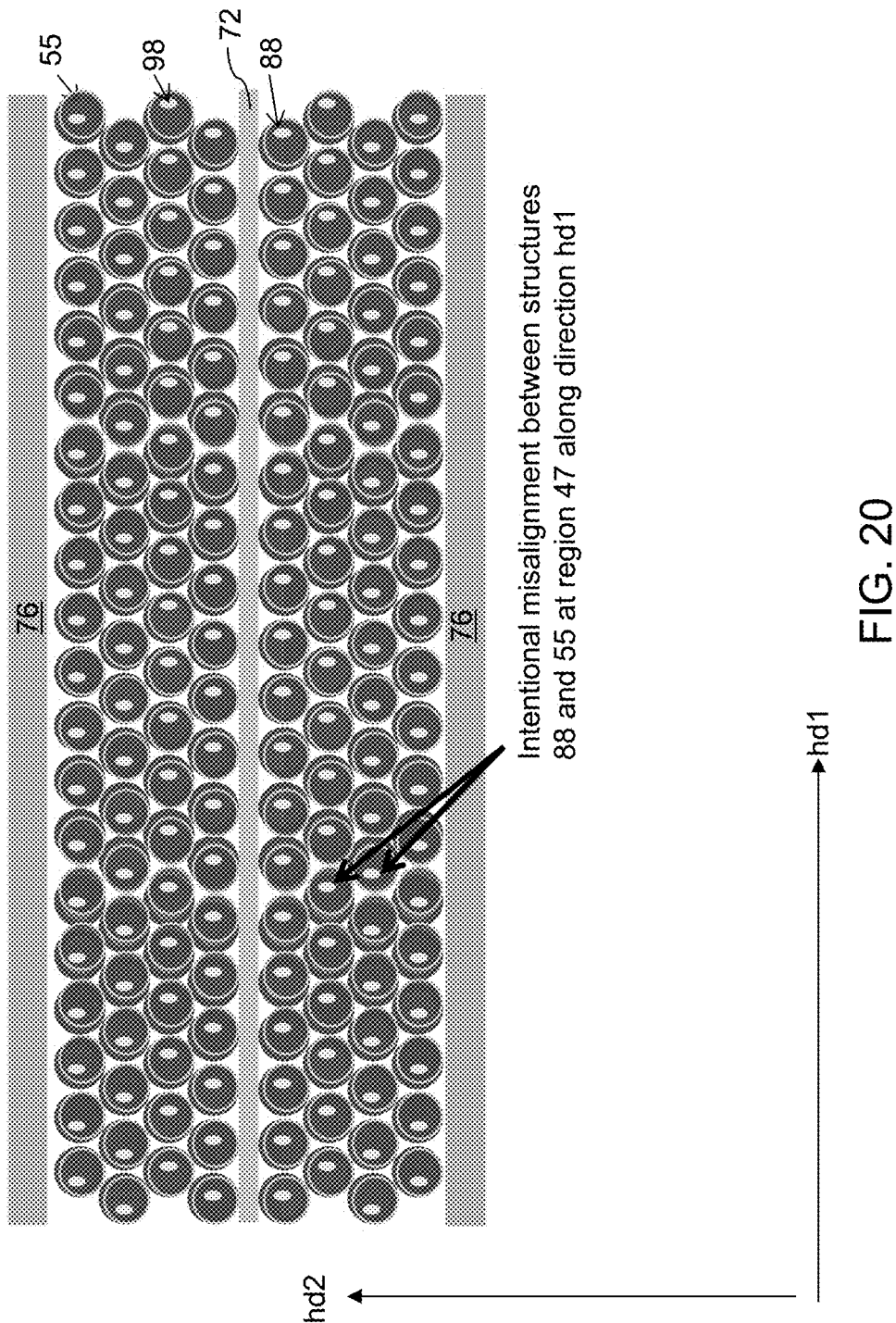
FIG. 20 is a top-down view of the second exemplary structure after formation of array contact via structures according to the second embodiment of the present disclosure.

Referring to FIG. 20, a top-down view of the second exemplary structure illustrates a layout of array contact via structures 98, which can be formed with uniform spacing along the first horizontal direction to accommodate bit lines to be subsequently formed with periodicity along the first horizontal direction hd1. Because of the presence of the channel space regions 47, the memory stack structures 55 are arranged with greater lateral spacing along the first horizontal direction around the channel spacer region 47. The array contact via structures 98 overlie the memory stack structures 55, and are electrically shorted to a respective underlying drain region 63. In one embodiment, a pillar shaped drain contact via structure 88 can be optionally formed between each vertically overlapping pair of a drain region 63 and an array contact via structure 98. For example, the pillar shaped structures 88 can be formed directly on the drain regions 63 and through the contact level dielectric layer 73. The array contact via structures 98 can be formed though a dielectric material layer overlying the contact level dielectric layer 73. The lateral offset of the array contact via structures 98 along the first horizontal direction from the axis of the geometrical center of the memory stack structures 55 can be selected such that the array contact via structures 98 can be centered on the array of bit lines 108 to be subsequently formed as illustrated in FIG. 21.

FIG. 21 illustrates a configuration in which the drain contact via structures 88 are omitted. In this case, the array contact via structures 98 can vertically extend through the contact level dielectric layer 73 and any overlying dielectric material layer that underlies the bit lines 108. The bit lines 108 can extend along the second horizontal direction hd2, and can have a uniform pitch throughout the entirety of the array of memory stack structures 55. Thus, the plurality of bit lines 108 extend along the uniform pitch horizontal direction.

The contact structures 88 and/or 98 electrically connect the plurality of bit lines 108 to drain regions 63 located above memory stack structures 55. The contact structures (88 and/or 98) located closer to the plurality of channel space regions 47 are offset from the underlying memory stack structures 55 by a larger distance then the respective contact structures (88 and/or 98) located father from the plurality of channel space regions 47.

The embodiments of FIGS. 20 and 21 permit formation of bit lines 108 and contact structures (88 and/or 98) with a constant pitch in the entire array by using a double patterning photolithography and etching method which is more difficult to use with different pitches between components. Even though the contact structures 88 and/or 98 are offset from the center of the drain regions 63 and underlying memory stack structures 55 around the channel space regions 47, there is sufficient overlap between the structures 88 and/or 98 and the drain regions 63 to form an electrical contact.

The second exemplary structure and alternate embodiments of the present disclosure can include a three-dimensional memory device, which can include an alternating stack (32, 46) of insulating layers 32 and electrically conductive layers 46 located over a substrate (9, 10), and memory stack structures 55 extending through the alternating stack (32, 46). Each of the memory stack structures 55 comprises a memory film 50 and a vertical semiconductor channel 60. The memory stack structures 55 can be arranged in at least one two-dimensional array AR2. Memory stack structures 55 within each of the at least one two-dimensional array AR2 can have a uniform pitch q0 along a uniform pitch horizontal direction (such as the second horizontal direction hd2) and a non-uniform pitch along a non-uniform pitch horizontal direction (such as the first horizontal direction hd1) that is perpendicular to the uniform pitch horizontal direction.

The three-dimensional memory device can include a pair of backside trenches 79 horizontally extending along a lengthwise direction (e.g., the first horizontal direction hd1) that is parallel to the non-uniform pitch horizontal direction. The at least one two-dimensional array AR2 of the memory stack structures 55 can be located between the pair of backside trenches 79.

In one embodiment, the uniform pitch horizontal direction (i.e., the second horizontal direction hd2) can be perpendicular to the lengthwise direction of the pair of backside trenches 79. The non-uniform pitch horizontal direction (i.e., the first horizontal direction hd1) can be parallel to the lengthwise direction of the pair of backside trenches 79.

In one embodiment, the at least one two-dimensional array AR2 can include a plurality of two-dimensional arrays AR2 that are laterally spaced along a horizontal direction (i.e., the second horizontal direction hd2) perpendicular to the lengthwise direction of the pair of backside trenches 79. Each of the plurality of two-dimensional arrays AR2 can include respective rows (or columns) R of memory stack structures 55 that extend along the uniform pitch horizontal direction (e.g., the second horizontal direction hd2). An inter-row (or inter-column) spacing (r0, r1) (i.e., pitch) between memory stack structures 55 within each two-dimensional array AR2 has a modulation along the non-uniform pitch direction. In one embodiment, the non-uniform pitch (r0, r1) consists of a first pitch r0 that is consecutively repeated at least twice at each occurrence, and a second pitch r1 that is greater than the first pitch r0 and occurs only in isolated instances between instances of the first pitch r0.

An inter-array region (corresponding to the areas of the drain select level isolation structures 72) can be located between a neighboring pair of two-dimensional arrays AR2, and can be free of memory stack structures 55. A plurality of channel space regions 47 that are free of memory stack structures 55 (i.e., a region located between the structures with pitch r1) extend between the inter-array region (that includes the drain select level isolation structures 72) and the pair of backside contact trenches 79.

In one embodiment, the alternating stack (32, 46) comprises a terrace region in which each electrically conductive layer 46 other than a topmost electrically conductive layer 46 within the alternating stack (32, 46) laterally extends farther than any overlying electrically conductive layer 46 within the alternating stack (32, 46). The terrace region includes stepped surfaces of the alternating stack (32, 46) that continuously extend from a bottommost layer 46 within the alternating stack (32, 46) to a topmost layer within the alternating stack (32, 46).

Each of the exemplary structures of the present disclosure can include a three-dimensional memory device. In one embodiment, the three-dimensional memory device comprises a vertical NAND memory device. The electrically conductive layers 46 can comprise, or can be electrically connected to, a respective word line of the monolithic three-dimensional NAND memory device. The substrate (9, 10) can comprise a silicon substrate. The vertical NAND memory device can comprise an array of monolithic three-dimensional NAND strings over the silicon substrate. At least one memory cell (as embodied as a portion of a charge storage layer 54 at a level of an electrically conductive layer 46) in a first device level of the array of monolithic three-dimensional NAND strings can be located over another memory cell (as embodied as another portion of the charge storage layer 54 at a level of another electrically conductive layer 46) in a second device level of the array of monolithic three-dimensional NAND strings. The silicon substrate can contain an integrated circuit comprising a driver circuit for the memory device located thereon. The electrically conductive layers 46 can comprise a plurality of control gate electrodes having a strip shape extending substantially parallel to the top surface of the substrate (9, 10), e.g., between a pair of backside trenches 79. The plurality of control gate electrodes comprises at least a first control gate electrode located in a first device level and a second control gate electrode located in a second device level. The array of monolithic three-dimensional NAND strings can comprise: a plurality of semiconductor channels (59, 11, 60), wherein at least one end portion 60 of each of the plurality of semiconductor channels (59, 11, 60) extends substantially perpendicular to a top surface of the substrate (9, 10); and a plurality of charge storage elements (as embodied as charge trapping material portions). Each charge storage element can be located adjacent to a respective one of the plurality of semiconductor channels (59, 11, 60).

The various methods of the present disclosure can be employed to eliminate or minimize formation of voids during formation of the electrically conductive layers (i.e., word lines/control gate electrodes and select gate electrodes). Specifically, the non-uniform pitch along at least one horizontal direction within the two-dimensional arrays AR2 of memory stack structures 55 can provide filling of the volumes of the backside recesses 43 beginning from regions distal from backside trenches 79 and ending at regions proximal to the backside recesses 79. Reduction of cavities in the electrically conductive layers 46 can reduce the resistivity of the electrically conductive layers 46 and increase structural strength of the three-dimensional memory device during, and after, formation of the electrically conductive layers 46. Thus, the various non-uniform pitches of the present disclosure can be advantageously employed to increase the performance of the three-dimensional memory device and/or increase the reliability of the three-dimensional memory device. The device density can also be increased with a decreased pitch.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising:
   an alternating stack of insulating layers and electrically conductive layers located over a substrate; and
   memory stack structures extending through the alternating stack,
   wherein:
   each of the memory stack structures comprises a memory film and a vertical semiconductor channel;
   the memory stack structures are arranged in at least one two-dimensional array;
   the memory stack structures within each of the at least one two-dimensional array have a non-uniform pitch along a non-uniform pitch horizontal direction; and
   a pair of backside trenches horizontally extending along a lengthwise direction, wherein:
   the at least one two-dimensional array of the memory stack structures is located between the pair of backside trenches;
   the at least one two-dimensional array is a single two-dimensional array that includes rows of one-dimensional periodic arrays having the uniform pitch;
   the rows of one-dimensional periodic arrays have a non-uniform inter-row spacing along the non-uniform pitch horizontal direction; and
   the non-uniform inter-row spacing increases with a lateral distance from a vertical plane that is equidistant from the pair of backside trenches toward either of the pair of the backside trenches.

2. The three-dimensional memory device of claim 1, wherein the memory stack structures within each of the at least one two-dimensional array also have a uniform pitch along a uniform pitch horizontal direction that is perpendicular to the non-uniform pitch horizontal direction.

3. The three-dimensional memory device of claim 1, wherein
   each backside trench includes a respective insulating spacer and a backside contact via structure that contacts a region within the substrate.

4. The three-dimensional memory device of claim 3, wherein:
   the uniform pitch horizontal direction is parallel to the lengthwise direction of the pair of backside trenches; and
   the non-uniform pitch horizontal direction is perpendicular to the lengthwise direction of the pair of backside trenches.

5. The three-dimensional memory device of claim 4, wherein the non-uniform inter-row spacing is at a minimum for a pair of rows that is most proximal to the vertical plane that is equidistant from the pair of backside trenches.

6. The three-dimensional memory device of claim 3, wherein:
   the uniform pitch horizontal direction is perpendicular to the lengthwise direction of the pair of backside trenches; and
   the non-uniform pitch horizontal direction is parallel to the lengthwise direction of the pair of backside trenches.

7. The three-dimensional memory device of claim 6, wherein:
   the at least one two-dimensional array comprises a plurality of two-dimensional arrays that are laterally spaced along a horizontal direction perpendicular to the lengthwise direction of the pair of backside trenches:
   each of the plurality of two-dimensional arrays includes respective rows of memory stack structures that extend along the uniform pitch horizontal direction; and
   an inter-row spacing within each two-dimensional array has a modulation along the non-uniform pitch direction.

8. The three-dimensional memory device of claim 7, wherein the non-uniform pitch consists of:
   a first pitch that is consecutively repeated at least twice at each occurrence; and
   a second pitch that is greater than the first pitch and occurs only in isolated instances between instances of the first pitch.

9. The three-dimensional memory device of claim 8, further comprising:
   an inter-array region located between a neighboring pair of two-dimensional arrays and which is free of memory stack structures;
   drain select level isolation structure located in the inter-array region; and
   a plurality of channel space regions that are free of memory stack structures extending through a region having the second pitch between the inter-array region and the pair of backside contact trenches.

10. The three-dimensional memory device of claim 1, wherein the memory stack structures within each of the at least one two-dimensional array also have a second non-uniform pitch along a second non-uniform pitch horizontal direction that is perpendicular to the non-uniform pitch horizontal direction.

11. The three-dimensional memory device of claim 1, wherein:
    the three-dimensional memory device comprises a monolithic three-dimensional NAND memory device;
    the electrically conductive layers comprise, or are electrically connected to, a respective word line of the monolithic three-dimensional NAND memory device;
    the substrate comprises a silicon substrate;
    the monolithic three-dimensional NAND memory device comprises an array of monolithic three-dimensional NAND strings over the silicon substrate;
    at least one memory cell in a first device level of the array of monolithic three-dimensional NAND strings is located over another memory cell in a second device level of the array of monolithic three-dimensional NAND strings;

the silicon substrate contains an integrated circuit comprising a driver circuit for the memory device located thereon;

the electrically conductive layers comprise a plurality of control gate electrodes having a strip shape extending substantially parallel to the top surface of the substrate, the plurality of control gate electrodes comprise at least a first control gate electrode located in the first device level and a second control gate electrode located in the second device level; and the array of monolithic three-dimensional NAND strings comprises:

a plurality of semiconductor channels, wherein at least one end portion of each of the plurality of semiconductor channels extends substantially perpendicular to a top surface of the substrate, and a plurality of charge storage elements, each charge storage element located adjacent to a respective one of the plurality of semiconductor channels.

12. A method of forming a three-dimensional memory device, comprising:

forming an alternating stack of insulating layers and sacrificial material layers over a substrate;

forming memory stack structures through the alternating stack, wherein each of the memory stack structures comprises a memory film and a vertical semiconductor channel;

forming a pair of backside trenches that horizontally extend along a lengthwise direction; and replacing the sacrificial material layers with electrically conductive layers through the pair of backside trenches;

wherein:

the memory stack structures are arranged in at least one two-dimensional array;

the memory stack structures within each of the at least one two-dimensional array have a non-uniform pitch along a non-uniform pitch horizontal direction;

the pair of backside trenches horizontally extends along a lengthwise direction, wherein:

the at least one two-dimensional array of the memory stack structures is located between the pair of backside trenches; and the at least one two-dimensional array is a single two-dimensional array that includes rows of one-dimensional periodic arrays having the uniform pitch;

the rows of one-dimensional periodic arrays have a non-uniform inter-row spacing along the non-uniform pitch horizontal direction; and the non-uniform inter-row spacing increases with a lateral distance from a vertical plane that is equidistant from the pair of backside trenches toward either of the pair of the backside trenches.

13. The method of claim 12, wherein the memory stack structures within each of the at least one two-dimensional array also have a uniform pitch along a uniform pitch horizontal direction.

14. The method of claim 13, further comprising:

forming an insulating spacer in each of the pair of backside trenches; and forming a backside contact via structure in each of the insulating spacers.

15. The method of claim 13, wherein:

the uniform pitch horizontal direction is parallel to the lengthwise direction of the pair of backside trenches; and the non-uniform pitch horizontal direction is perpendicular to the lengthwise direction of the pair of backside trenches.

16. The method of claim 15, wherein the non-uniform inter-row spacing is at a minimum for a pair of rows that is most proximal to the vertical plane that is equidistant from the pair of backside trenches.

17. The method of claim 16, wherein precursors for the electrically conductive layers flow from the pair of backside trenches through wider, partially filled inter-row spaces located father from the vertical plane to fully fill the narrower inter-row spaces closer to the vertical plane.

18. The method of claim 13, wherein:

the uniform pitch horizontal direction is perpendicular to the lengthwise direction of the pair of backside trenches; and the non-uniform pitch horizontal direction is parallel to the lengthwise direction of the pair of backside trenches.

19. The method of claim 18, wherein:

the at least one two-dimensional array comprises a plurality of two-dimensional arrays that are laterally spaced along a horizontal direction perpendicular to the lengthwise direction of the pair of backside trenches:

each of the plurality of two-dimensional arrays includes respective rows of memory stack structures that extend along the uniform pitch horizontal direction; and an inter-row spacing within each two-dimensional array has a modulation along the non-uniform pitch direction.

20. The method of claim 19, wherein the non-uniform pitch consists of:

a first pitch that is consecutively repeated at least twice at each occurrence; and a second pitch that is greater than the first pitch and occurs only in isolated instances between instances of the first pitch.

21. The method of claim 20, wherein:

a plurality of channel space regions that are free of memory stack structures extend through a region having the second pitch; and precursors for the electrically conductive layers flow from the pair of backside trenches through wider, partially filled channel space regions to fully fill the narrower spaces between memory stack structures in a region having the first pitch.

22. The method of claim 21, further comprising:

a plurality of bit lines which extend along the uniform pitch horizontal direction; and contact structures which electrically connect the plurality of bit lines to drain regions located above memory stack structures, wherein the contact structures closer to the plurality of channel space regions are offset from the underlying memory stack structures by a larger distance then contact structures located father from the plurality of channel space regions.

23. The method of claim 12, wherein:

the three-dimensional memory device comprises a monolithic three-dimensional NAND memory device;

the electrically conductive layers comprise, or are electrically connected to, a respective word line of the monolithic three-dimensional NAND memory device;

the substrate comprises a silicon substrate;

the monolithic three-dimensional NAND memory device comprises an array of monolithic three-dimensional NAND strings over the silicon substrate;

at least one memory cell in a first device level of the array of monolithic three-dimensional NAND strings is located over another memory cell in a second device level of the array of monolithic three-dimensional NAND strings;

the silicon substrate contains an integrated circuit comprising a driver circuit for the memory device located thereon;

the electrically conductive layers comprise a plurality of control gate electrodes having a strip shape extending substantially parallel to the top surface of the substrate, the plurality of control gate electrodes comprise at least a first control gate electrode located in the first device level and a second control gate electrode located in the second device level; and the array of monolithic three-dimensional NAND strings comprises:
  a plurality of semiconductor channels, wherein at least one end portion of each of the plurality of semiconductor channels extends substantially perpendicular to a top surface of the substrate, and
  a plurality of charge storage elements, each charge storage element located adjacent to a respective one of the plurality of semiconductor channels.

24. A three-dimensional memory device comprising:
an alternating stack of insulating layers and electrically conductive layers located over a substrate; and
memory stack structures extending through the alternating stack,
wherein:
  each of the memory stack structures comprises a memory film and a vertical semiconductor channel;
  the memory stack structures are arranged in at least one two-dimensional array; and
  the memory stack structures within each of the at least one two-dimensional array have a non-uniform pitch along a non-uniform pitch horizontal direction,
wherein the three-dimensional memory device comprises a feature selected from:
  a first feature that the memory stack structures within each of the at least one two-dimensional array also have a second non-uniform pitch along a second non-uniform pitch horizontal direction that is perpendicular to the non-uniform pitch horizontal direction; and
  a second feature that:
    the three-dimensional memory device further comprises a pair of backside trenches horizontally extending along a lengthwise direction that is parallel to a direction selected from the uniform pitch horizontal direction and the non-uniform pitch horizontal direction;
    the at least one two-dimensional array of the memory stack structures is located between the pair of backside trenches; and
    each backside trench includes a respective insulating spacer and a backside contact via structure that contacts a region within the substrate;
    the uniform pitch horizontal direction is perpendicular to the lengthwise direction of the pair of backside trenches; and
    the non-uniform pitch horizontal direction is parallel to the lengthwise direction of the pair of backside trenches.

25. The three-dimensional memory device of claim 24, wherein the three-dimensional memory device comprises the first feature.

26. The three-dimensional memory device of claim 24, wherein the three-dimensional memory device comprises the second feature.

* * * * *